US008647517B2

(12) United States Patent
Yokai et al.

(10) Patent No.: US 8,647,517 B2
(45) Date of Patent: Feb. 11, 2014

(54) PRODUCING METHOD OF SUSPENSION BOARD WITH CIRCUIT

(75) Inventors: Takahiko Yokai, Osaka (JP); Yasunari Ooyabu, Osaka (JP); Toshiki Naito, Osaka (JP)

(73) Assignee: Nitto Denko Corporation, Osaka (JP)

( * ) Notice: Subject to any disclaimer, the term of this patent is extended or adjusted under 35 U.S.C. 154(b) by 854 days.

(21) Appl. No.: 12/216,589

(22) Filed: Jul. 8, 2008

(65) Prior Publication Data

US 2009/0014410 A1 Jan. 15, 2009

Related U.S. Application Data

(60) Provisional application No. 60/935,054, filed on Jul. 24, 2007.

(30) Foreign Application Priority Data

Jul. 9, 2007 (JP) ................................ 2007-180204
Apr. 22, 2008 (JP) ................................ 2008-111653

(51) Int. Cl.
*H01B 13/00* (2006.01)
*B44C 1/22* (2006.01)

(52) U.S. Cl.
USPC .................. 216/13; 216/17; 216/22; 216/41; 174/250; 174/262

(58) Field of Classification Search
USPC .............................. 216/13, 41; 174/250, 262
See application file for complete search history.

(56) References Cited

U.S. PATENT DOCUMENTS

| | | | | |
|---|---|---|---|---|
| 3,567,533 | A | 3/1971 | Chiang et al. | |
| 3,647,582 | A | 3/1972 | Putnam et al. | |
| 6,055,133 | A | 4/2000 | Albrecht et al. | |
| 2005/0036241 | A1 | 2/2005 | Tsuda et al. | |
| 2005/0167281 | A1 | 8/2005 | Ohsawa et al. | |
| 2007/0051694 | A1 | 3/2007 | Asai et al. | |
| 2007/0062729 | A1* | 3/2007 | Asai et al. | 174/262 |
| 2007/0109729 | A1* | 5/2007 | Fujii et al. | 361/600 |

FOREIGN PATENT DOCUMENTS

| | | |
|---|---|---|
| JP | 2007-59627 A | 3/2007 |
| JP | 2007-109725 | 4/2007 |

OTHER PUBLICATIONS

Machine English translation of JP-2007-109725A.*
Decision to Refuse a European Patent Application issued by EPO on Jul. 29, 2013, in connection with corresponding European Patent Application No. 08159998.7.

* cited by examiner

*Primary Examiner* — Shamim Ahmed
(74) *Attorney, Agent, or Firm* — Jean C. Edwards, Esq.; Edwards Neils PLLC

(57) ABSTRACT

A producing method of a suspension board with circuit includes simultaneously forming a conductive pattern formed on an insulating layer formed on a metal supporting board and having a terminal portion for connecting to an electronic component, and a mark formed on the metal supporting board, or on the insulating layer and having an opening for forming a reference hole for mounting the electronic component, and forming the reference hole by etching the metal supporting board disposed in the opening of the mark, or the insulating layer and the metal supporting board each disposed in the opening of the mark.

13 Claims, 16 Drawing Sheets

5B
(4)
1
6(4)
6(4)
2
A
10
9
22
21
A
5A
(4)

(a)

(b)

(c)

(d)

(e)

(f)

(g)

(h)

(i)

(j)

(k)

(l)

(m)

1

(j)

(k)

(l)

(m)

1

(a)

(b)

(c)

(d)

(e)

(f)

(g)

(h)

(i)

(j)

(k)

(l)

(m)

(j)
(k)
(l)
(m)
(n)
1

(a)

(b)

(c)

(d)

(e)

(f)
(g)
(h)
(i)
(j)
4
5
6
7
8
9
10
11
15
16
17
19
3
2
1

(a)

(b)

(c)

(d)

(e)

(f)

(g)

(h)

(i)

(a)

(b)

(c)

(d)

(e)

(f)

(g)

(h)

(i)

(j)

PRODUCING METHOD OF SUSPENSION BOARD WITH CIRCUIT

CROSS-REFERENCE TO RELATED APPLICATION

The present application claims the benefit of U.S. Provisional Application No. 60/935,054 filed on Jul. 24, 2007, and claims priority from Japanese Patent Application No. 2007-180204 filed on Jul. 9, 2007, and Japanese Patent Application No. 2008-111653 filed on Apr. 22, 2008, the contents of which are herein incorporated by reference in their entirety.

BACKGROUND OF THE INVENTION

1. Field of the Invention

The present invention relates to a producing method of a suspension board with circuit and, more particularly, to a producing method of a suspension board with circuit on which an electronic component is mounted.

2. Description of the Related Art

A suspension board with circuit is used in a hard disk drive. In the suspension board with circuit, a wired circuit pattern including terminal portions for connecting to a magnetic head is formed integrally on a suspension board for supporting the magnetic head. Specifically, the suspension board with circuit includes the suspension board made of stainless steel, an insulating base layer made of polyimide and formed on the suspension board, and the wired circuit pattern made of copper and formed on the insulating base layer.

On such a suspension board with circuit, a magnetic head is mounted using tooling holes opened in a metal supporting board as a reference, and a terminal of the magnetic head is connected to the terminal portions (see, e.g., Japanese Unexamined Patent No. 2007-109725).

In the suspension board with circuit, an positioning mark is formed simultaneously with the formation of an insulating base layer. Using the positioning mark as a reference, a photomask for forming a wired circuit pattern is positioned, and a photomask for forming the tooling holes is further positioned.

SUMMARY OF THE INVENTION

That is, in the method described above, the common positioning mark is used as the reference to first position the photomask for forming the wired circuit pattern during the formation of the wired circuit pattern, and then position the photomask for forming the tooling holes during the formation of the tooling holes.

However, in the method described above, the photomask for forming the wired circuit pattern, and the photomask for forming the tooling holes are used individually in different process steps.

As a result, it is possible to position the photomask for forming the wired circuit pattern or the photomask for forming the tooling holes with respect to the positioning mark. However, relative positioning of the formed wired circuit pattern and the formed tooling holes includes both of the tolerance of the photomask for forming the wired circuit pattern with respect to the positioning mark and the tolerance of the photomask for forming the tooling holes with respect to the positioning mark. Accordingly, it is difficult to improve accuracy.

On the other hand, to mount the magnetic head using the tooling holes as a reference, and connect the terminal of the magnetic head and the terminal portions of the wired circuit pattern, it is necessary to effect accurate relative positioning of the tooling holes and the wired circuit pattern.

It is therefore an object of the present invention to provide a producing method of a suspension board with circuit which allows accurate mounting of an electronic component, and accurate connection of a terminal of the electronic component and terminal portions of a conductive pattern.

A producing method of a suspension board with circuit according to the present invention includes simultaneously forming a conductive pattern formed on an insulating layer formed on a metal supporting board and having a terminal portion for connecting to an electronic component, and a mark formed on the metal supporting board, or on the insulating layer and having an opening for forming a reference hole for mounting the electronic component, and forming the reference hole by etching the metal supporting board disposed in the opening of the mark, or the insulating layer and the metal supporting board each disposed in the opening of the mark.

In the method, the conductive pattern and the mark are simultaneously formed. This allows accurate relative positioning of the conductive pattern and the mark.

Since the reference hole is formed based on the opening of the mark, it is possible to reliably connect a terminal of the electronic component which is mounted using the reference mark as the reference, and the terminal portion which is accurately positioned relatively to the mark.

As a result, a suspension board with circuit excellent in connection reliability can be obtained.

In the producing method of the suspension board with circuit according to the present invention, it is preferable that, in the step of simultaneously forming the conductive pattern and the mark, the conductive pattern and the mark are each formed of a conductive layer, and of a seed film formed on a lower surface of the conductive layer and, in the step of forming the reference hole, the reference hole is formed by etching the metal supporting board exposed from the seed film of the mark, or the insulating layer and the metal supporting board each exposed from the seed film of the mark using the seed film as an etching resist.

In the method, the metal supporting board exposed from the seed film of the mark is etched, or the insulating layer and the metal supporting board each exposed from the seed film of the mark are etched using the seed film as the etching resist. This allows reliable formation of the reference hole by a simple and convenient method.

In the producing method of the suspension board with circuit according to the present invention, it is preferable that the step of simultaneously forming the conductive pattern and the mark includes forming the seed film on the insulating layer, and on the metal supporting board exposed from the insulating layer, laminating a photoresist on the seed film, exposing the photoresist to light via a photomask, and then developing the photoresist to form a plating resist in a pattern reverse to the conductive pattern, and to a pattern of the mark, laminating the conductive layer on the seed film exposed from the plating resist, removing the plating resist, and removing the seed film exposed from the conductive layer to form the conductive pattern and the mark, and the step of forming the reference hole includes forming a second etching resist so as to cover the conductive pattern, and partly expose the mark, etching the conductive layer of the partly exposed mark using the second etching resist as an etching resist, and etching the metal supporting board exposed from the seed film of the mark using the seed film as an etching resist to form the reference hole.

In the method, by accurately forming the photomask, the conductive pattern and the mark can be more accurately positioned relatively to each other. In addition, the reference hole can be formed by a simple and convenient method in which only the metal supporting board is etched.

In the producing method of the suspension board with circuit according to the present invention, it is preferable that the step of simultaneously forming the conductive pattern and the mark includes forming the seed film on the insulating layer, laminating a photoresist on the seed film, exposing the photoresist to light via a photomask, and then developing the photoresist to form a plating resist in a pattern reverse to the conductive pattern, and to a pattern of the mark, laminating the conductive layer on the seed film exposed from the plating resist, removing the plating resist, and removing the seed film exposed from the conductive layer to form the conductive pattern and the mark, and the step of forming the reference hole includes forming a second etching resist so as to cover the conductive pattern, and partly expose the mark, etching the conductive layer of the partly exposed mark using the second etching resist as an etching resist, and etching the insulating layer and the metal supporting board each exposed from the seed film of the mark using the seed film as an etching resist to form the reference hole.

In the method, by accurately forming the photomask, the conductive pattern and the mark can be more accurately positioned relatively to each other. Since the conductive pattern and the mark are both formed in the insulating layer, more accurate relative positioning can be ensured.

In the producing method of the suspension board with circuit according to the present invention, it is preferable that the step of simultaneously forming the conductive pattern and the mark includes laminating a photoresist on the conductive layer laminated on the insulating layer via the seed film, exposing the photoresist to light via a photomask, and then developing the photoresist to form a first etching resist in the same pattern as the conductive pattern, and as a pattern of the mark, etching the conductive layer and the seed film each exposed from the first etching resist to form the conductive pattern and the mark, and removing the first etching resist, and the step of forming the reference hole includes forming a second etching resist so as to cover the conductive pattern, and partly expose the mark, etching the conductive layer of the partly exposed mark using the second etching resist as an etching resist, and etching the insulating layer and the metal supporting board each exposed from the seed film of the mark using the seed film as an etching resist to form the reference hole.

In the method, by accurately forming the photomask, the conductive pattern and the mark can be more accurately positioned relatively to each other. In addition, the number of process steps can be reduced.

In the producing method of the suspension board with circuit according to the present invention, it is preferable that, in the step of simultaneously forming the conductive pattern and the mark, the conductive pattern and the mark are each formed of at least a conductive layer and, in the step of forming the reference hole, the reference hole is formed by forming metal plating layers on a surface of the conductive pattern, and on a surface of the mark, and then etching the insulating layer and the metal supporting board each exposed from the metal plating layer on the surface of the mark using the metal plating layer formed on the surface of the mark as an etching resist.

In the method, since the etching is performed using the metal plating layer as the etching resist, the reference hole can be formed reliably by a simple and convenient method.

In the producing method of the suspension board with circuit according to the present invention, it is preferable that the step of simultaneously forming the conductive pattern and the mark includes forming the seed film on the insulating layer, laminating a photoresist on the seed film, exposing the photoresist to light via a photomask, and then developing the photoresist to form a plating resist in a pattern reverse to the conductive pattern, and to a pattern of the mark, laminating the conductive layer on the seed film exposed from the plating resist, removing the plating resist, and removing the seed film exposed from the conductive layer to form the conductive pattern and the mark, and the step of forming the reference hole includes forming a second etching resist so as to cover the metal plating layer on the surface of the conductive pattern, and partly expose the metal plating layer on the surface of the mark.

In the method, by accurately forming the photomask, the conductive pattern and the mark can be more accurately positioned relatively to each other.

In the producing method of the suspension board with circuit according to the present invention, it is preferable that the step of simultaneously forming the conductive pattern and the mark includes laminating a photoresist on the conductive layer laminated on the insulating layer, exposing the photoresist to light via a photomask, and then developing the photoresist to form a first etching resist in the same pattern as the conductive pattern, and as a pattern of the mark, etching the conductive layer exposed from the first etching resist to form the conductive pattern and the mark, and removing the first etching resist, and the step of forming the reference hole includes forming a second etching resist so as to cover the metal plating layer on the surface of the conductive pattern, and partly expose the metal plating layer on the surface of the mark.

In the method, by accurately forming the photomask, the conductive pattern and the mark can be more accurately positioned relatively to each other. In addition, the number of process steps can be reduced.

In the producing method of the suspension board with circuit according to the present invention, it is preferable that, in the step of simultaneously forming the conductive pattern and the mark, the photoresist is exposed to light via the single photomask.

In the method, the photoresist is formed through one-time exposure to light via the single photomask to allow accurate relative positioning of the conductive pattern and the mark.

DETAILED DESCRIPTION OF THE INVENTION

Figure 1:
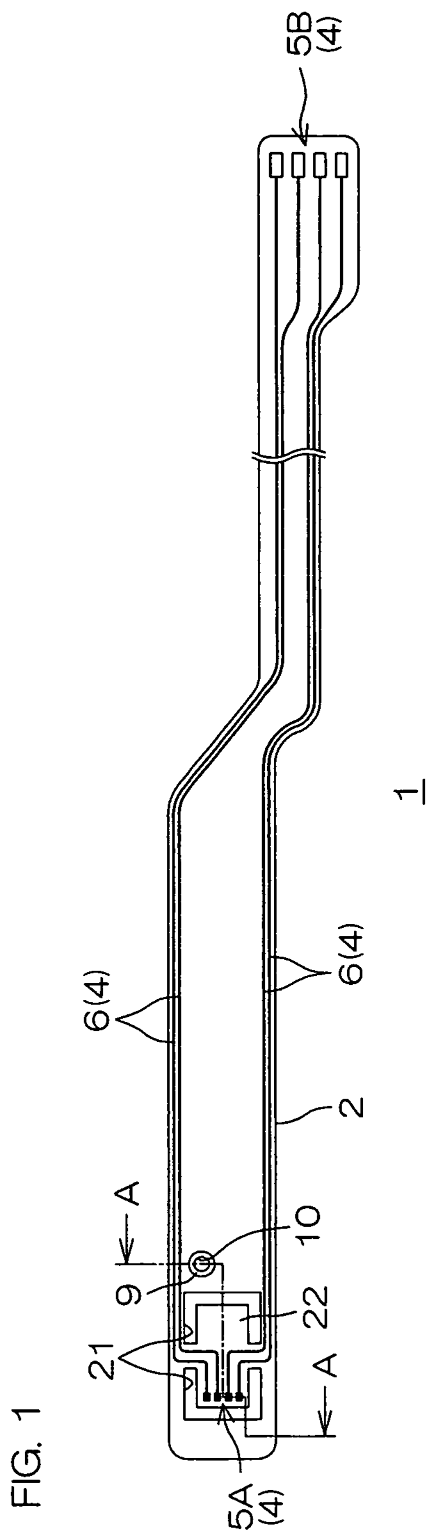
FIG. 1 is a plan view of a suspension board with circuit produced by a producing method of a suspension board with circuit according to an embodiment of the present invention.
Figure 2:
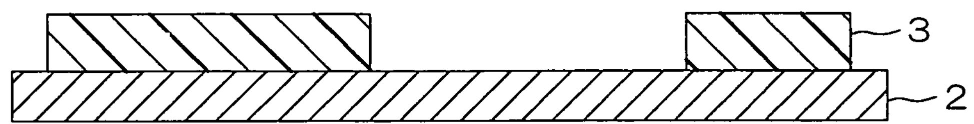
FIG. 2 is a producing process view of the producing method of the suspension board with circuit shown in FIG. 1, which is taken along the line A-A of FIG. 1, (a) showing the step of preparing a metal supporting board, (b) showing the step of forming an insulating base layer on the metal supporting board, (c) showing the step of forming a seed film on the insulating base layer, and on the metal supporting board exposed from the insulating base layer, (d) showing the step of laminating a photoresist on the seed film, and (e) showing the step of exposing the photoresist to light via a photomask.
Figure 2:
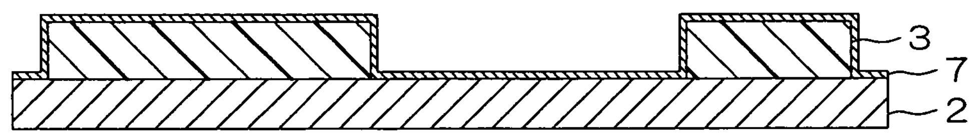
Figure 2:
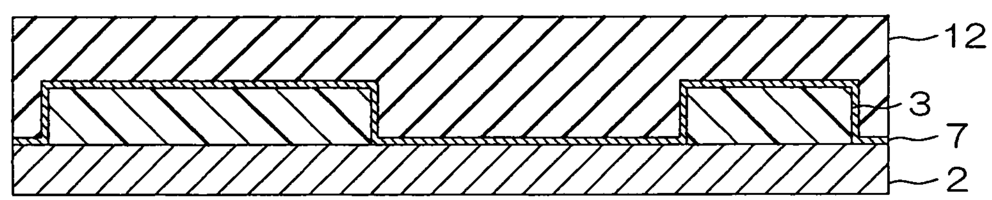
Figure 2:
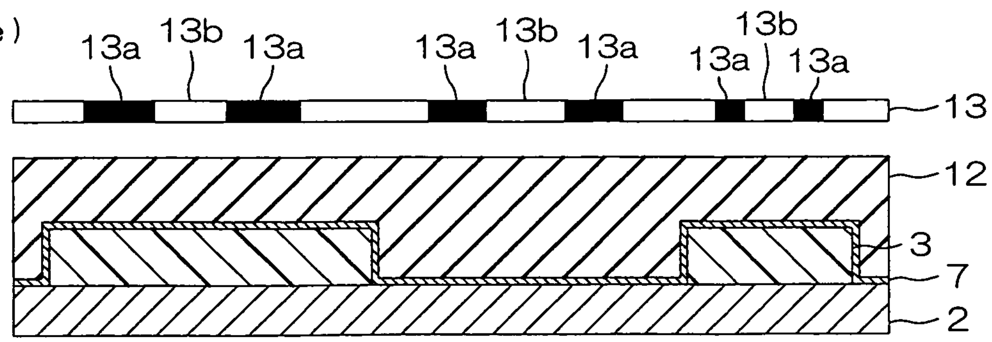
Figure 3:
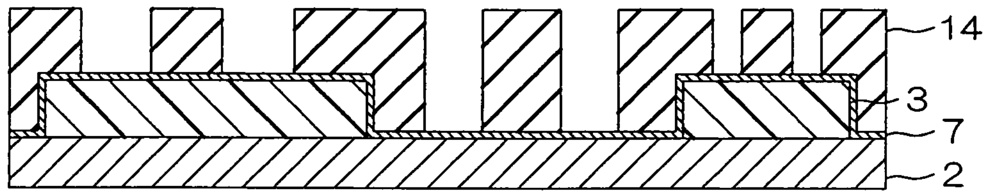
FIG. 3 is a producing process view of the producing method of the suspension board with circuit shown in FIG. 1, subsequently to FIG. 2, which is taken along the line A-A of FIG. 1, (f) showing the step of developing the photoresist to form a plating resist in a pattern reverse to a conductive pattern, and to the pattern of a mark, (g) showing the step of laminating a conductive layer on the seed film exposed from the plating resist, (h) showing the step of removing the plating resist, and (i) showing the step of removing the seed film exposed from the conductive layer.
Figure 3:
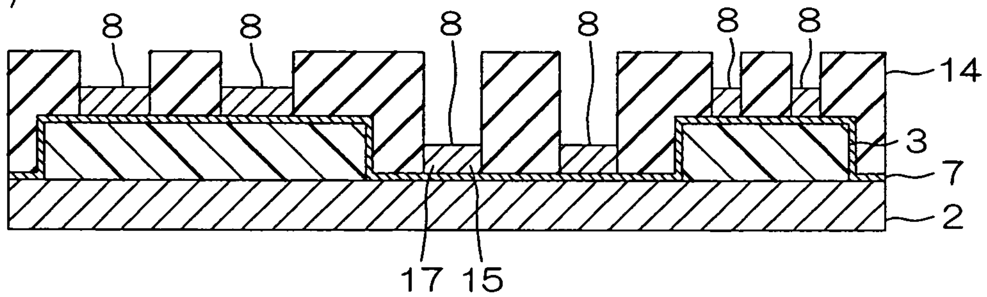
Figure 3:
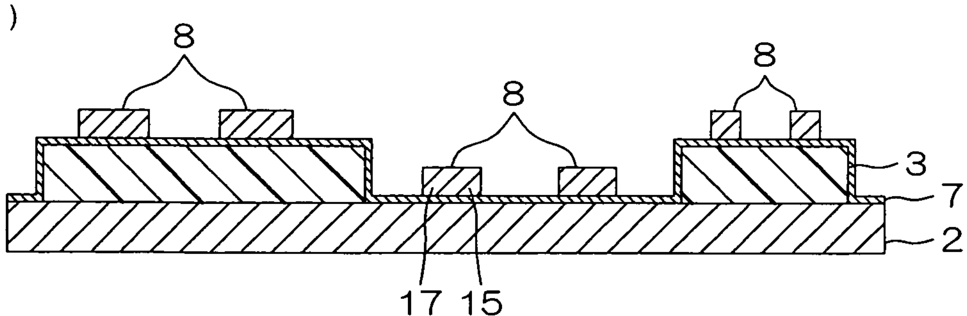
Figure 3:
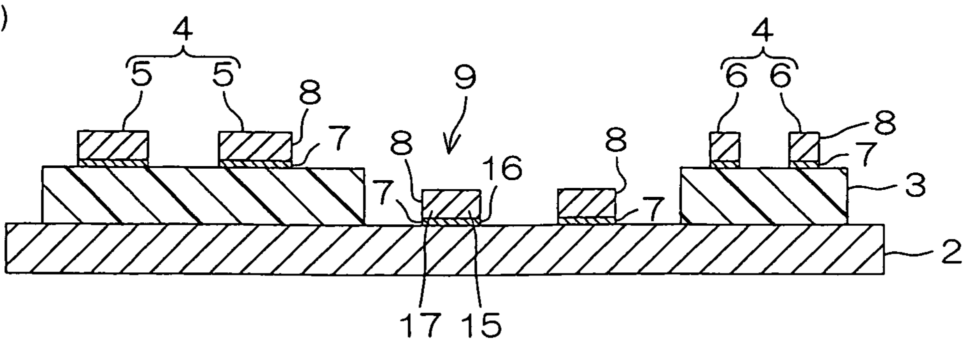
Figure 4:
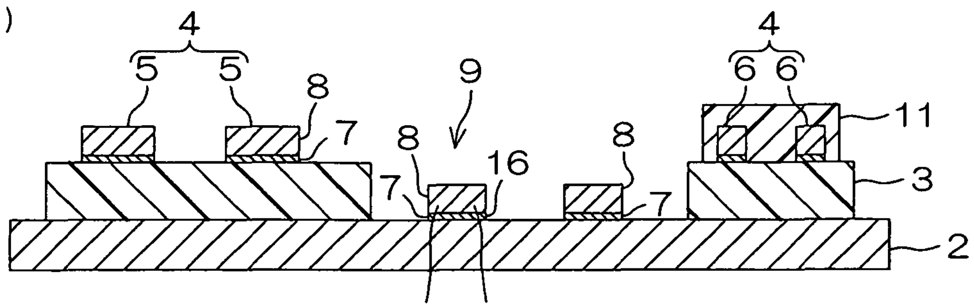
FIG. 4 is a producing process view of the producing method of the suspension board with circuit shown in FIG. 1, subsequently to FIG. 3, which is taken along the line A-A of FIG. 1, (j) showing the step of forming an insulating cover layer on the insulating base layer, (k) showing the step of forming a second etching resist so as to cover the conductive pattern, and partly expose the mark, (l) showing the step of etching the metal supporting board exposed from the seed film, and (m) showing the step of removing the second etching resist.
Figure 4:
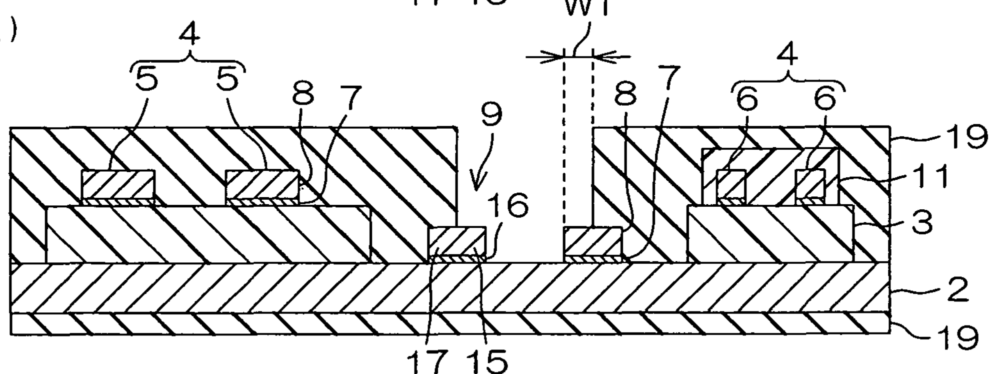
Figure 4:
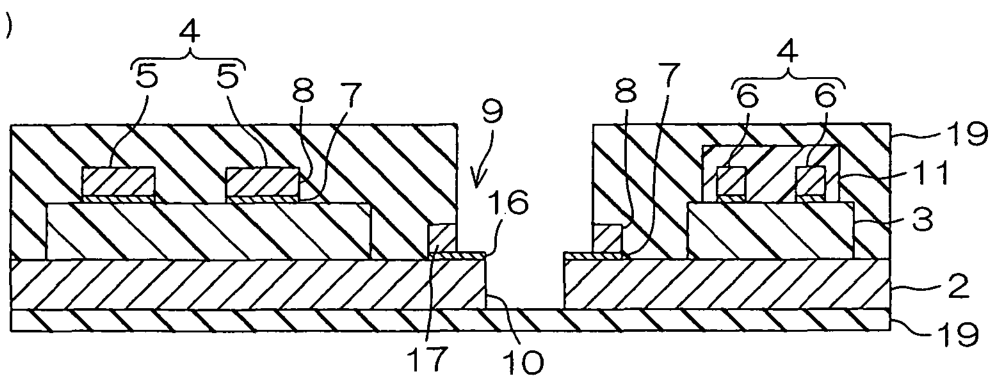
Figure 4:
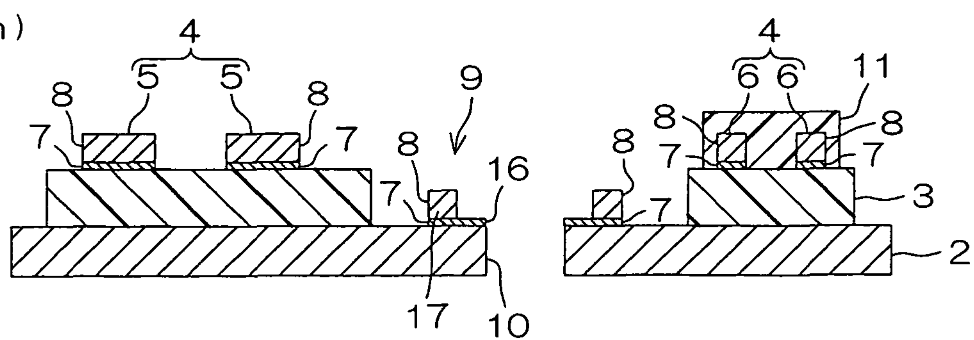

FIG. 1 is a plan view of a suspension board with circuit produced by a producing method of a suspension board with circuit according to an embodiment of the present invention. FIGS. 2 to 4 are producing process views of the producing method of the suspension board with circuit shown in FIG. 1, which are each taken along the line A-A of FIG. 1. In FIG. 1, an insulating base layer 3 and an insulating cover layer 11, each described later, are omitted for clear illustration of relative positioning of a conductive pattern 4 to a metal supporting board 2.

In FIG. 1, in a suspension board with circuit 1, the conductive pattern 4 for connecting a magnetic head (not shown) of a hard disk drive and a read/write board (not shown) is formed integrally on the metal supporting board 2 on which the magnetic head is mounted.

The conductive pattern 4 integrally includes magnetic-head-side connection terminal portions 5A for connecting to a terminal of the magnetic head as an electronic component, external connection terminal portions 5B for connecting to a terminal of the read/write board as an electronic component, and a plurality of wires 6 for connecting the magnetic-head-side connection terminal portions 5A and the external connection terminal portions 5B (which may be hereinafter collectively and simply referred to as "terminal portions 5").

The metal supporting board 2 is formed in a flat belt-like shape extending in a longitudinal direction. The magnetic-head-side connection terminal portions 5A are provided at one longitudinal end portion (hereinafter referred to as a front end portion) of the metal supporting board 2. The external connection terminal portions 5B are provided at the other longitudinal end portion (hereinafter referred to as a rear end portion) of the metal supporting board 2.

The front end portion of the suspension board with circuit 1 is also provided with a gimbal 22 for mounting the magnetic head and a reference hole 10.

The gimbal 22 is formed at the portion where the magnetic head is mounted. The gimbal 22 is formed with cut-away portions 21 sandwiching the magnetic-head-side connection terminal portions 5A therebetween in the longitudinal direction.

The reference hole 10 is used as a reference in positioning the magnetic head when the magnetic head is mounted. The reference hole 10 is formed at a widthwise midpoint and rearward of the gimbal 22 to have a generally circular shape when viewed in plan view, and extend through the metal supporting board 2 in the thickness direction thereof. The diameter of the reference hole 10 is in the range of, e.g., 300 to 1000 μm.

As shown in FIG. 4(*m*), the suspension board with circuit 1 includes the metal supporting board 2, the insulating base layer 3 as an insulating layer formed on the metal supporting board 2, the conductive pattern 4 formed on the insulating base layer 3, and the insulating cover layer 11 formed on the insulating base layer 3 so as to cover the conductive pattern 4.

The insulating base layer 3 is formed on the surface of the metal supporting board 2 to correspond to the portion where the conductive pattern 4 is formed.

The conductive pattern 4 is formed of a seed film 7 laminated on the surface of the metal supporting board 2, and a conductive layer 8 laminated on the surface (upper surface) of the seed film 7.

The insulating cover layer 11 is formed so as to cover the wires 6, and expose the terminal portions 5 as well as a mark 9 described later.

As shown in FIG. 1, the mark 9 is provided on the front side of the suspension board with circuit 1.

As shown in FIGS. 1 and 4(*m*), the mark 9 is disposed on the peripheral edge of the reference hole 10, and formed in a generally annular shape when viewed in plan view. The mark 9 is made of the seed film 7, and the conductive layer 8 formed on the top (upper surface) of the seed film 7, and formed with an opening 16 for forming the reference hole 10, which has a generally circular shape when viewed in plan view.

The opening 16 is formed to be at the same position as that of the reference hole 10 when viewed in plan view.

The inner end portion 15 of the conductive layer 8 of the mark 9 is removed by etching when the reference hole 10 is formed, which is described later. As a result, the conductive layer 8 of the mark 9 is formed so as to expose the portion of the seed film 7 from which the inner end portion 15 is removed, and surround the reference hole 10 in spaced apart relation when viewed in plan view.

Next, a description is given to a producing method of the suspension board with circuit 1 with reference to FIGS. 2 to 4.

First, as shown in FIG. 2(*a*), the metal supporting board 2 is prepared in the method.

Examples of a metal material used to form the metal supporting board 2 include stainless steel, and a 42-alloy. Preferably, stainless steel is used. The thickness of the metal supporting board 2 is in the range of, e.g., 10 to 60 μm, or preferably 15 to 30 μm.

Next, as shown in FIG. 2(*b*), the insulating base layer 3 is formed on the metal supporting board 2.

Examples of an insulating material used to form the insulating base layer 3 include synthetic resins such as a polyimide resin, a polyamide imide resin, an acrylic resin, a polyether nitrile resin, a polyether sulfone resin, a polyethylene terephthalate resin, a polyethylene naphthalate resin, a polyvinyl chloride resin, and a fluorine resin. Preferably, a photosensitive synthetic resin is used, or more preferably a photosensitive polyimide resin is used.

To form the insulating base layer 3 using, e.g., a photosensitive polyimide resin, e.g., a varnish (a photosensitive polyamic acid resin solution) of a photosensitive polyimide resin precursor is uniformly coated first on the surface of the metal supporting board 2, and dried by heating at a temperature of, e.g., 70 to 120° C. to form a base coating. Then, the base coating is exposed to light via a photomask not shown, developed, and then cured (imidized) by heating at a temperature of 300° C. or more to form the insulating base layer 3 in the foregoing pattern.

The thickness of the insulating base layer 3 thus formed is in the range of, e.g., 1 to 30 μm, or preferably 2 to 20 μm.

Then, as shown in FIGS. 2(*c*) to 3(*i*), the conductive pattern 4 and the mark 9 are simultaneously formed by an additive method.

When the conductive pattern 4 and the mark 9 are simultaneously formed by the additive method, the seed film 7 is formed first on the insulating base layer 3, and on the metal supporting board 2 exposed from the insulating base layer 3, as shown in FIG. 2(*c*).

Examples of a material used to form the seed film 7 include metal materials such as chromium, gold, silver, platinum, nickel, titanium, silicon, manganese, zirconium, an alloy thereof, and an oxide thereof. Preferably, chromium is used. The seed film 7 may also be formed of a plurality of layers.

The seed film 7 is formed by, e.g., sputtering, electrolytic plating, or electroless plating. Preferably, the seed film 7 is formed by sputtering.

For the sputtering, sputtering which sputters the metal mentioned above as a target is used. Preferably, chromium sputtering is used, whereby a chromium thin film is laminated.

The thickness of the seed film 7 thus formed is in the range of, e.g., 0.01 to 1 μm, or preferably 0.01 to 0.1 μm.

Next, as shown in FIG. 2(*d*), a photoresist 12 is laminated on the seed film 7.

As the photoresist, a dry film resist, e.g., is laminated on the surface of the seed film 7.

Then, as shown in FIG. 2(*e*), the photoresist 12 is exposed to light via a photomask 13, and then developed, as shown in FIG. 3(*f*), to form a plating resist 14 in a pattern reverse to the conductive pattern 4, and to the pattern of the mark 9.

As shown in FIG. 2(*e*), a pattern for forming the conductive pattern 4, and a pattern for forming the mark 9 are integrally formed in the single photomask 13. Specifically, the photomask 13 includes light shield portions 13*a* which do not allow transmission of light therethrough, and light transmission portions 13*b* which allow transmission of light therethrough in the foregoing pattern. In the case of performing patterning with a negative image, the photomask 13 is disposed to oppose the light shield portions 13*a* to the portions where the conductive pattern 4 and the mark 9 are formed, and oppose the light transmission portions 13*b* to the portions where the conductive pattern 4 and the mark 9 are not formed, and then the photoresist 12 is exposed to light.

Thereafter, as shown in FIG. 3(*f*), the unexposed portions opposed to the light shield portions 13*a*, i.e., the portions where the conductive pattern 4 and the mark 9 are formed are removed by development. For the development, a dipping method, a spraying method, or the like is used.

In this manner, the plating resist 14 is formed in the pattern reverse to the conductive pattern 4, and to the pattern of the mark 9 on the surface of the seed film 7.

In the case of performing patterning with a positive image, the photomask 13 is disposed by reversing the respective positions of the light shield portions 13*a* and the light transmission portions 13*b*, i.e., by opposing the light transmission portions 13*b* of the photomask 13 to the portions where the conductive pattern 4 and the mark 9 are formed, and then the photoresist 12 is exposed to light, and developed.

Then, as shown in FIG. 3(*g*), the conductive layer 8 is laminated on the seed film 7 exposed from the plating resist 14.

Examples of a conductive material used to form the conductive layer 8 include metals such as copper, nickel, gold, a solder, and an alloy thereof. Among them, copper is preferably used.

The conductive layer 8 is laminated by, e.g., electrolytic plating, or preferably electrolytic copper plating.

The thickness of the conductive layer 8 thus laminated is in the range of, e.g., 5 to 20 μm, or preferably 5 to 15 μm.

Then, as shown in FIG. 3(*h*), the plating resist 14 is removed. The plating resist 14 is removed by, e.g., etching, stripping, or the like.

Then, as shown in FIG. 3(*i*), the seed film 7 exposed from the conductive layer 8 is removed.

The seed film 7 exposed from the conductive layer 8 is removed by, e.g., etching, stripping, or the like.

As a result, the conductive pattern 4 and the mark 9, each made of the seed film 7 and the conductive pattern 8, can be simultaneously formed.

Then, as shown in FIG. 4(*j*), the insulating cover layer 11 is formed in the foregoing pattern on the insulating base layer 3.

As an insulating material for forming the insulating cover layer 11, the same insulating material as used to form the insulating base layer 3 mentioned above is used.

To form the insulating cover layer 11 using, e.g., a photosensitive polyimide resin, e.g., a varnish (a photosensitive polyamic acid resin solution) of a photosensitive polyimide resin precursor is uniformly coated first on the surface of the insulating base layer 3 including the conductive pattern 4 and the mark 9, and dried by heating at a temperature of, e.g., 70 to 120° C. to form a cover coating. Then, the cover coating is exposed to light via a photomask not shown, developed, and then cured (imidized) by heating at a temperature of 300° C. or more to form the insulating cover layer 11 in the foregoing pattern.

The thickness of the insulating cover layer 11 thus formed is in the range of, e.g., 2 to 10 μm, or preferably 3 to 6 μm.

Then, as shown in FIGS. 4(*k*) to 4(*m*), the reference hole 10 is formed.

To form the reference hole 10, a second etching resist 19 is formed first to cover the conductive pattern 4, and partly expose the mark 9, as shown in FIG. 4(*k*). Specifically, the second etching resist 19 is formed to expose the inner end portion 15 of the conductive layer 8 having a generally annular shape when viewed in plan view in the mark 9. The width W1 of the inner end portion 15 of the conductive layer 8 exposed from the second etching resist 19 is in the range of, e.g., 20 to 60 μm.

The second etching resist 19 is formed in the foregoing pattern by, e.g., laminating a dry film resist on the surface of the insulating base layer 3 including the conductive pattern 4 and the mark 9, on the surface of the insulating cover layer 11, and on the back surface of the metal supporting board 2 and then exposing the dry film to light, and developing it.

Then, as shown in FIG. 4(*l*), the inner end portion 15 of the conductive layer 8 exposed from the second etching resist 19 is etched using the second etching resist 19 as an etching resist (mask), and the metal supporting board 2 exposed from the seed film 7 of the mark 9 is etched using the seed film 7 as an etching resist (mask).

For the etching, chemical etching using, e.g., an etchant such as ferric chloride aqueous solution dissolving copper and stainless steel is used.

Then, as shown in FIG. 4(*m*), the second etching resist 19 is removed. The second etching resist 19 is removed by, e.g., etching, stripping, or the like.

Thus, in this method, the conductive pattern 4 and the mark 9 are simultaneously formed in the method, the conductive pattern 4 and the mark 9 can be accurately positioned relatively to each other. In particular, by accurately forming the pattern for forming the conductive pattern 4 (terminal portions 5) and the pattern for forming the mark 9 in the photomask 13 (see FIG. 2(*e*)), it is possible to form the plating resist 14 through one-time exposure to light, and effect more accurate positioning of the magnetic-head-side connection terminal portions 5A and the mark 9.

In addition, since the metal supporting board 2 exposed from the seed film 7 of the mark 9 is etched using the seed film 7 as an etching resist, the reference hole 10 can be reliably formed by a simple and convenient method.

This allows reliable connection of the terminal of the magnetic head mounted using the reference hole 10 as a reference and the magnetic-head-side connection terminal portions 5A accurately positioned relatively to the mark 9.

Moreover, the reference hole 10 can be formed by a simple and easy method in which only the metal supporting board 2 is etched.

As a result, it is possible to obtain the suspension board with circuit 1 excellent in connection reliability at low producing cost.

In the description given above, the reference hole 10 and the opening 16 are each formed in the generally circular shape when viewed in plan view. However, it is also possible to form the reference hole 10 and the opening 16 each in an appropriate shape such as, e.g., a rectangular shape when viewed in plan view.

Figure 5:
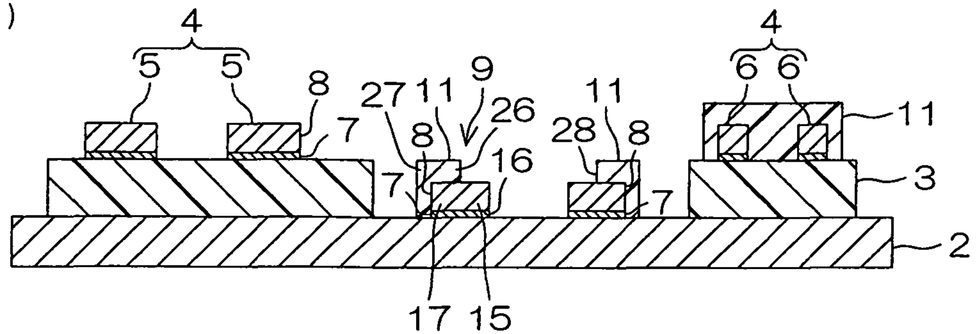
FIG. 5 is a producing process view of the producing method of the suspension board with circuit according to another embodiment of the present invention, which corresponds to FIGS. 4(*j*) to 4(*m*), (j) showing the step of forming the insulating cover layer on the insulating base layer so as to partly expose the mark, (k) showing the step of forming the second etching resist so as to cover the conductive pattern, and expose the inner end portion of the insulating cover layer formed on the upper surface of the mark, (l) showing the step of etching the conductive layer of the mark exposed from the insulating cover layer, and exposing the metal supporting board exposed from the seed film, and (m) showing the step of removing the second etching resist.
Figure 5:
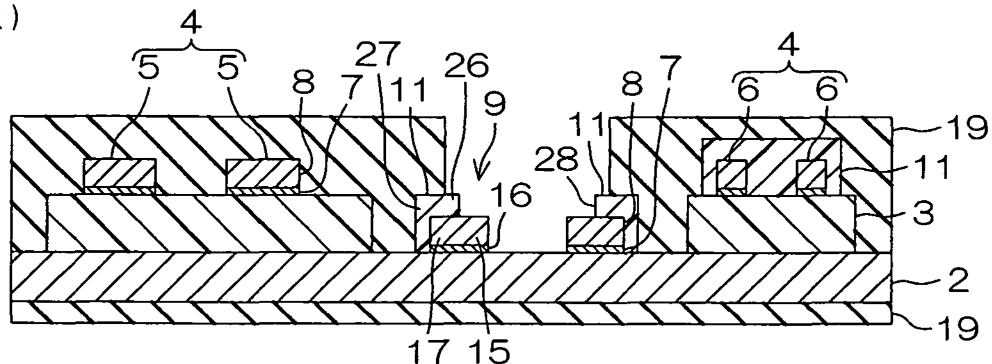
Figure 5:
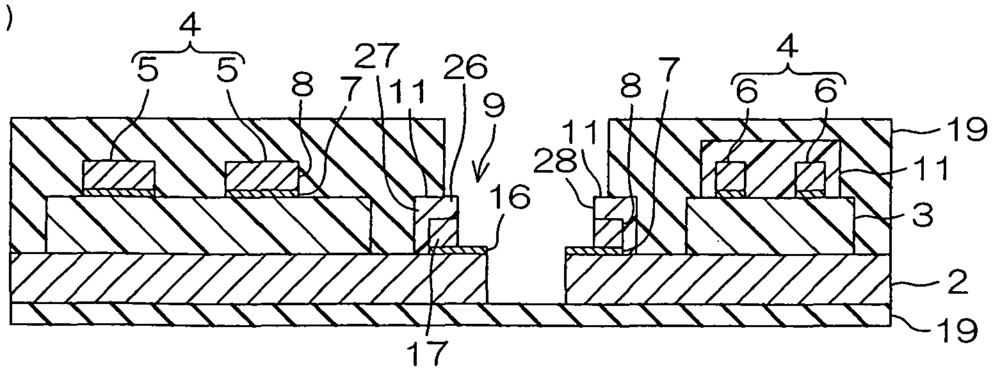
Figure 5:
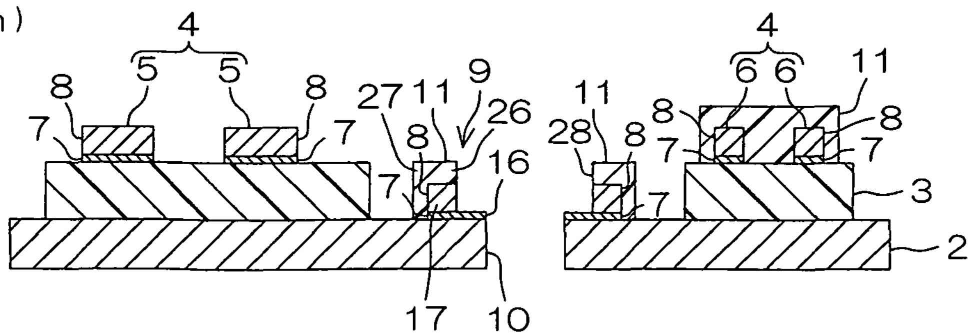

Next, a description is given to the producing method of the suspension board with circuit according to another embodiment of the present invention with reference to FIG. 5. In each of the subsequent drawings, components corresponding to the individual components described above are provided with the same reference numerals, and a detailed description thereof is omitted.

In the description of FIG. 4(*l*) given above, the second etching resist 19 is used as the etching resist (mask) in the etching of the conductive layer 8. However, it is also possible to use, e.g., the insulating cover layer 11 as the etching resist (mask), as shown in FIG. 5(*l*).

That is, as shown in FIG. 5(*j*), the insulating cover layer 11 is formed so as to partly expose the mark 9. Specifically, the insulating cover layer 11 is formed in a pattern formed with a cover opening 28 for exposing the opening 16 of the mark 9. In short, the insulating cover layer 11 is formed to expose the surfaces (upper surface and inner side surface) of the inner end portion 15 of the mark 9, and cover the surfaces (upper surface and outer side surface) of an outer end portion 17 of the mark 9.

In the method, the insulating cover layer 11 is formed in the foregoing pattern, as shown in FIG. 5(*j*).

Next, as shown in FIG. 5(*k*), the second etching resist 19 is formed so as to cover the conductive pattern 4, cover an outer end portion 27 of the insulating cover layer 11, and expose an inner end portion 26 of the insulating cover layer 11. Specifically, in the second etching resist 19, the end edge of the opening for exposing the cover opening 28 is disposed outside (longitudinally outward and widthwise outward) and spaced apart from the cover opening 28.

Next, as shown in FIG. 5(*l*), the inner end portion 15 of the conductive layer 8 of the mark 9 exposed from the cover opening 28 is etched using the insulating cover layer 11 as an etching resist (mask). At the same time, the metal supporting board 2 exposed from the seed film 7 is etched using the seed film 7 of the mark 9 as an etching resist. For the etching of the conductive layer 8 and the metal supporting board 2, the same etching as mentioned above is used.

Thereafter, as shown in FIG. 5(*m*), the second etching resist 19 is removed in the same manner as described above.

Thus, in the method, the conductive layer 8 of the mark 9 can be etched using the insulating cover layer 11 as the etching resist.

Figure 8:
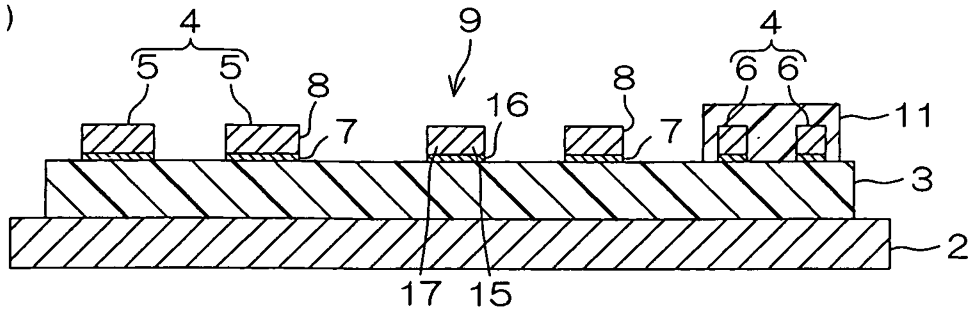
FIG. 8 is a producing process view of the producing method of the suspension board with circuit according to the still another embodiment of the present invention, subsequently to FIG. 7, which is taken along the line A-A of FIG. 1, (j) showing the step of forming the insulating cover layer on the insulating base layer, (k) showing the step of forming the second etching resist so as to cover the conductive pattern, and partly expose the mark, (l) showing the step of etching the conductive layer exposed from a cover opening of the insulating cover layer, and the insulating base layer exposed from the seed film, and (m) showing the step of etching the metal supporting board exposed from the seed film, and removing the second etching resist.
Figure 8:
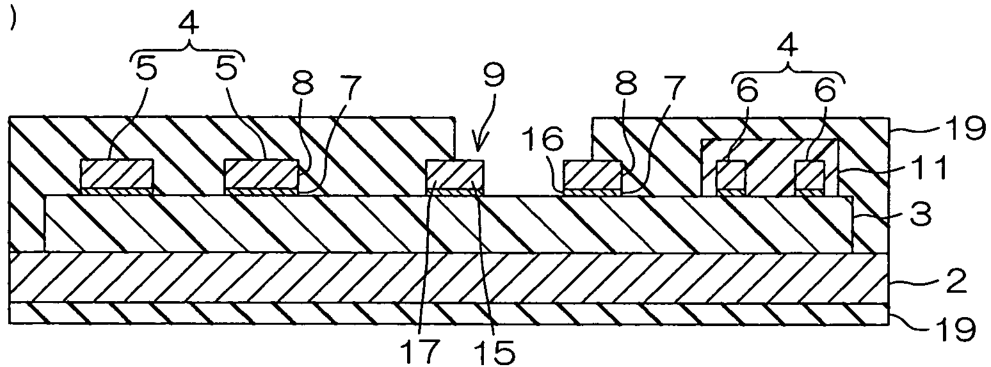
Figure 8:
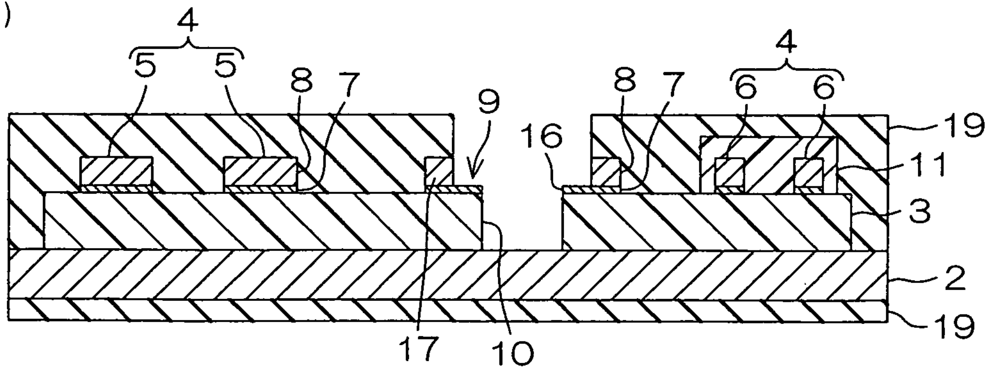
Figure 8:
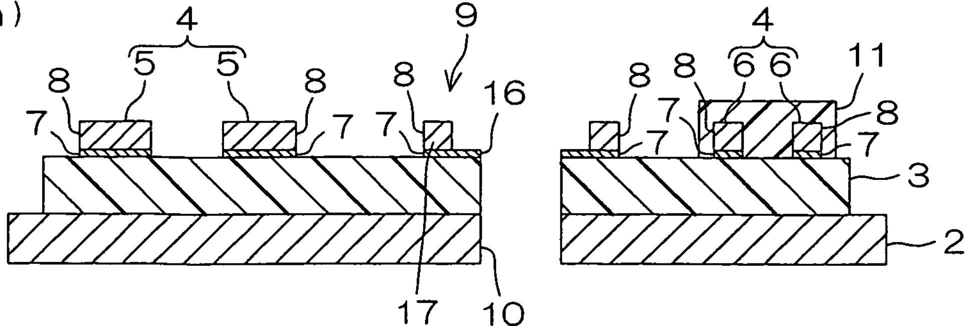

Next, a description is given to the suspension board with circuit produced by the producing method of the suspension board with circuit according to still another embodiment of the present invention with reference to FIG. 8(*m*).

As shown in FIG. 8(*m*), in the suspension board with circuit 1, the insulating base layer 3 is formed on the surface of the metal supporting board 2 to correspond to the portions where the conductive pattern 4 and the mark 9 are formed.

The reference hole 10 is opened to extend through the metal supporting board 2 and the insulating base layer 3 in the thickness direction thereof.

Figure 6:
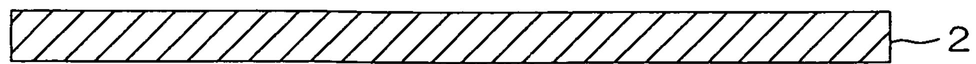
FIG. 6 is a producing process view of the producing method of the suspension board with circuit according to still another embodiment of the present invention, which is taken along the line A-A of FIG. 1, (a) showing the step of preparing the metal supporting board, (b) showing the step of forming the insulating base layer on the metal supporting board, (c) showing the step of forming the seed film on the insulating base layer, and on the metal supporting board exposed from the insulating base layer, (d) showing the step of laminating the photoresist on the seed film, and (e) showing the step of exposing the photoresist to light via the photomask.
Figure 6:
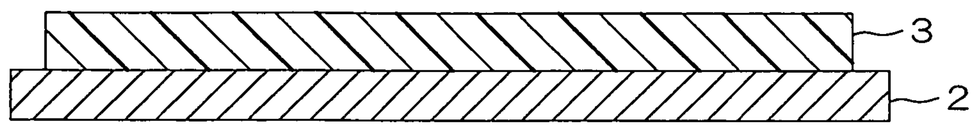
Figure 6:
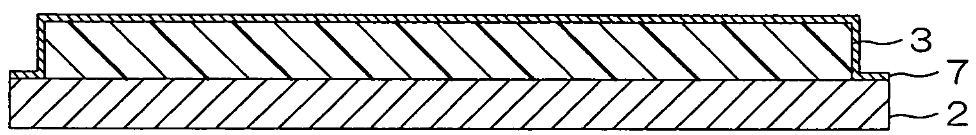
Figure 6:
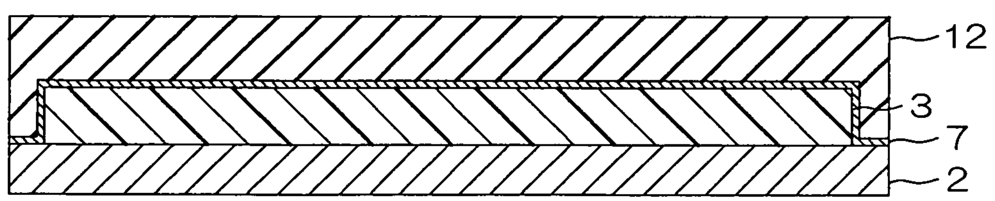
Figure 6:
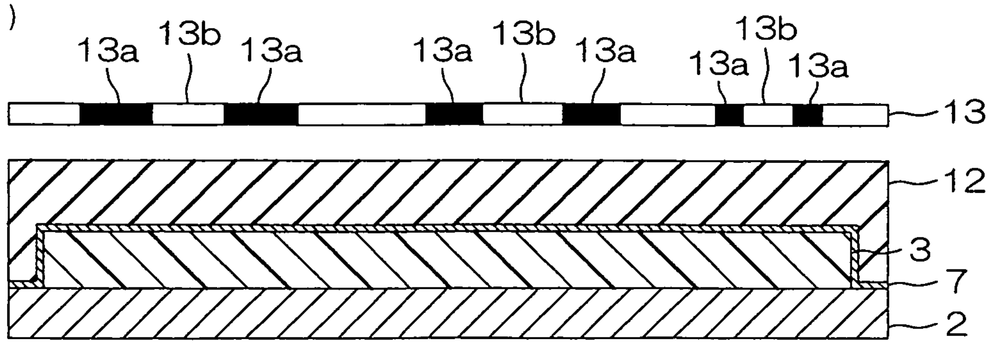
Figure 7:
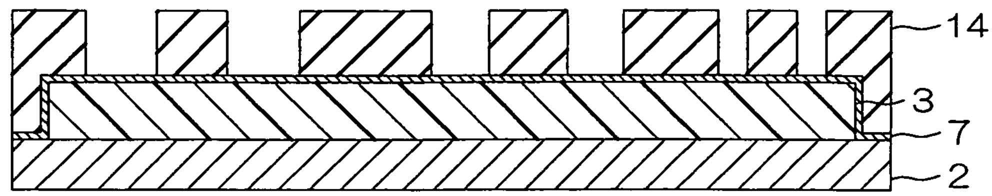
FIG. 7 is a producing process view of the producing method of the suspension board with circuit according to the still another embodiment of the present invention, subsequently to FIG. 6, which is taken along the line A-A of FIG. 1, (f) showing the step of developing the photoresist to form the plating resist in the pattern reverse to the conductive pattern, and to the pattern of the mark, (g) showing the step of laminating the conductive layer on the seed film exposed from the plating resist, (h) showing the step of removing the plating resist, and (i) showing the step of removing the seed film exposed from the conductive layer.
Figure 7:
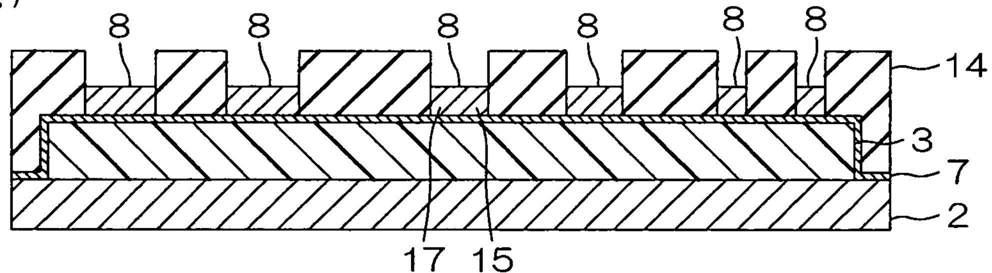
Figure 7:
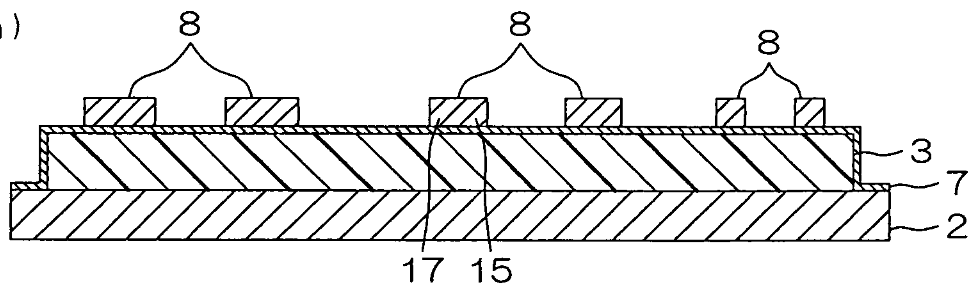
Figure 7:
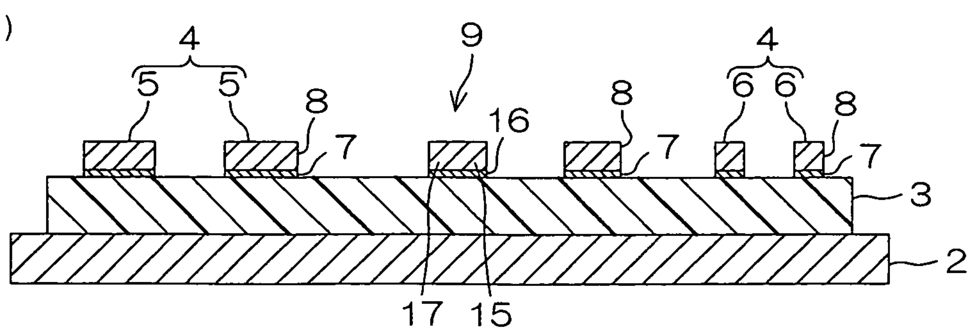

Next, a description is given to the producing method of the suspension board with circuit 1 with reference to FIGS. 6 to 8.

First, as shown in FIG. 6(*a*), the metal supporting board 2 is prepared in the method. A metal material for forming the metal supporting board 2, and the thickness of the metal supporting board 2 are the same as mentioned above.

Next, as shown in FIG. 6(*b*), the insulating base layer 3 is formed in the foregoing pattern on the metal supporting board 2. For the formation of the insulating base layer 3, the same method as described above is used.

Next, as shown in FIGS. 6(*c*) to 7(*i*), the conductive pattern 4 and the mark 9 are simultaneously formed by an additive method.

To simultaneously form the conductive pattern 4 and the mark 9 by the additive method, the seed film 7 is formed first on the insulating base layer 3, and on the metal supporting board 2 exposed from the insulating base layer, as shown in FIG. 6(*c*). The seed film 7 is formed by the same method as described above.

Next, as shown in FIG. 6(*d*), the photoresist 12 is laminated on the seed film 7. The photoresist 12 is laminated by the same method as described above.

Next, as shown in FIG. 6(*e*), the photoresist 12 is exposed to light via the photomask 13, and then developed, as shown in FIG. 7(*f*), to form the plating resist 14 in a pattern reverse to the conductive pattern 4, and to the pattern of the mask 9. For the exposure of the photoresist 12 to light and the development thereof, the same method as described above is used.

Next, as shown in FIG. 7(*g*), the conductive layer 8 is laminated on the seed film 7 exposed from the plating resist 14. The conductive layer 8 is laminated by the same method as described above.

Next, as shown in FIG. 7(*h*), the plating resist 14 is removed by the same method as described above.

Next, as shown in FIG. 7(*i*), the seed film 7 exposed from the conductive layer 8 is removed by the same method as described above.

In this manner, the conductive pattern 4 and the mark 9, each made of the seed film 7 and the conductive layer 8, can be formed simultaneously.

Next, as shown in FIG. 8(*j*), the insulating cover layer 11 is formed in the foregoing pattern on the insulating base layer 3. For the formation of the insulating cover layer 11, the same method as described above is used.

Next, as shown in FIGS. 8(*k*) to 8(*m*), the reference hole 10 is formed.

To form the reference hole 10, the second etching resist 19 is formed first so as to cover the conductive pattern 4, and partly expose the mark 9 in the same manner as described above, as shown in FIG. 8(*k*).

Next, as shown in FIG. 8(*l*), the conductive layer 8 exposed from the second etching resist 19 is etched using the second etching resist 19 as an etching resist. At the same time, the insulating base layer 3 exposed from the seed film 7 is etched using the seed film 7 as an etching resist (mask). For the etching of the insulating base layer 3, chemical etching using an alkaline aqueous solution or the like is used.

Thereafter, as shown in FIGS. 8(*l*) and 8(*m*), the inner end portion 15 of the conductive layer 8 exposed from the second etching resist 19 is etched using the second etching resist 19 as an etching resist (mask), and the metal supporting board 2 exposed from the seed film 7 is etched using the seed film 7 as an etching resist (mask). For the etching of the conductive layer 8 and the metal supporting board 2, the same etching as mentioned above is used.

Thereafter, as shown in FIG. 8(*m*), the second etching resist 19 is removed in the same manner as described above.

Thus, in this method, the conductive pattern 4 and the mark 9 are both formed on the insulating base layer 3 in the method, more accurate relative positioning can be ensured.

Figure 9:
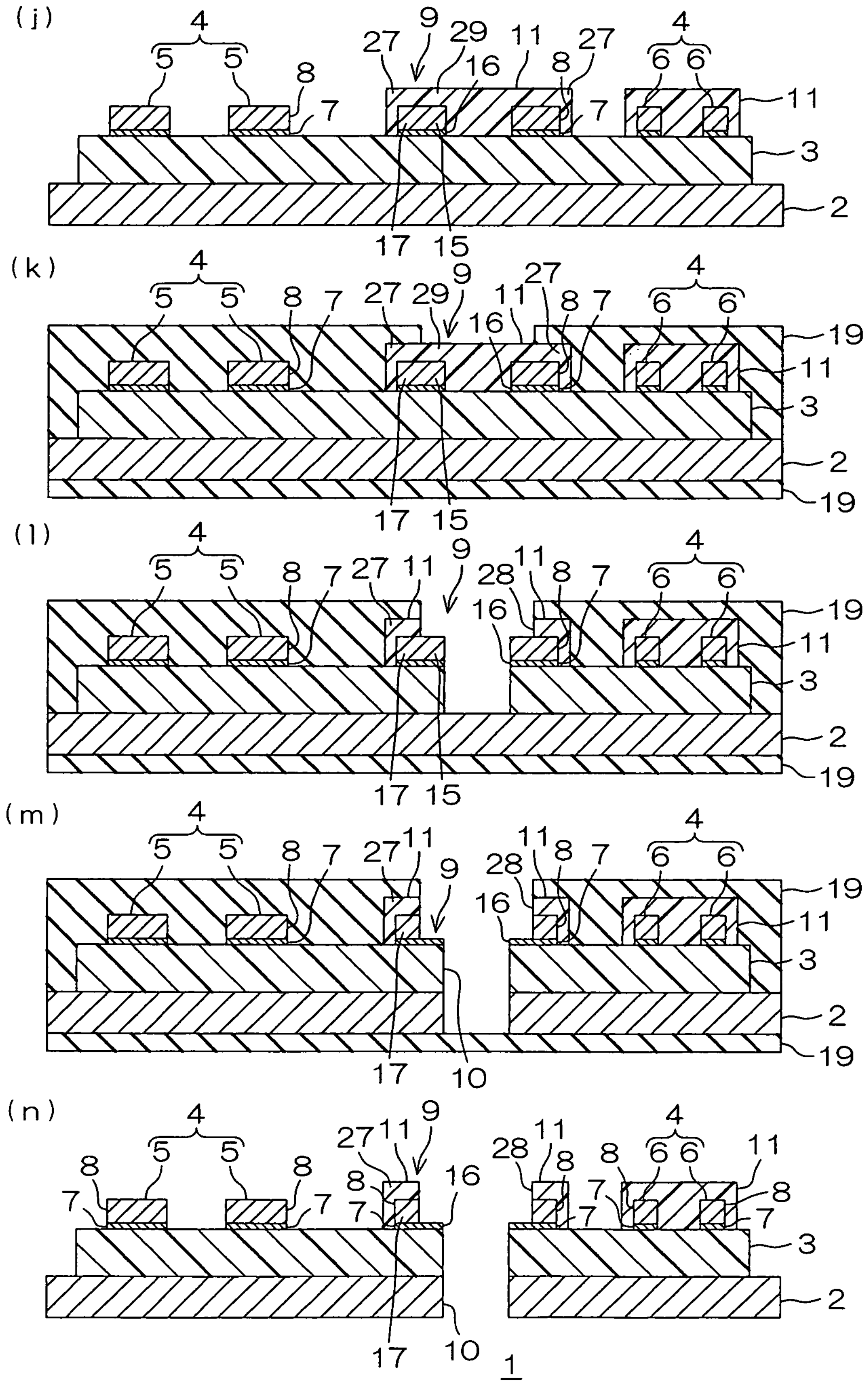
FIG. 9 is a producing process view of the producing method of the suspension board with circuit according to yet another embodiment of the present invention, which corresponds to FIGS. 8(*j*) to 8(*m*), (j) showing the step of forming the insulating cover layer on the insulating base layer so as to cover the mark, (k) showing the step of forming the second etching resist so as to cover the conductive pattern, and expose the inner end portion of the insulating cover layer formed on the upper surface of the mark, (l) showing the step of etching the insulating cover layer exposed from the second etching resist, and etching the insulating base layer exposed from the mark, (m) showing the step of etching the conductive layer exposed from the cover opening of the insulating cover layer, and etching the metal supporting board exposed from the seed film, and (n) showing the step of removing the second etching resist.

Next, a description is given to the producing method of the suspension board with circuit according to yet another embodiment of the present invention with reference to FIG. 9.

In the description of FIG. 8(*l*) given above, only the second etching resist 19 is used as an etching resist (mask) in the etching of the conductive layer 8. However, it is also possible to use, e.g., the second etching resist 19 and the insulating cover layer 11, as shown in FIG. 9(*l*).

That is, as shown in FIG. 9(*j*), the insulating cover layer 11 is formed to cover the mark 9 in the producing of the suspension board with circuit 1. In short, the insulating cover layer 11 is formed to be filled in the opening 16 of the mark 9, and cover the surfaces (upper surface and both side surfaces) of the mark 9.

In the method, the insulating cover layer 11 is formed in the foregoing pattern, as shown in FIG. 9(*j*).

Then, as shown in FIG. 9(*k*), the second etching resist 19 is formed to cover the conductive pattern 4, cover the outer end portions 27 of the insulating cover layer 11 formed on the surface (upper surface) of the mark 9, and expose a middle portion 29.

Then, as shown in FIG. 9(*l*), the middle portion 29 of the insulating cover layer 11 exposed from the second etching resist 19 is etched using the second etching resist 19 as an etching resist. At the same time, the insulating base layer 3 exposed from the mark 9 is etched using the mark 9 as an etching resist. For the etching of the insulating cover layer 11 and the insulating base layer 3, the same etching as used for the etching of the insulating base layer 3 is used.

Then, as shown in FIG. 9(*m*), the metal supporting board 2 exposed from the seed film 7 is etched using the seed film 7 as an etching resist. For the etching of the metal supporting board 2, the same method as described above is used.

Then, as shown in FIG. 9(*n*), the second etching resist 19 is removed in the same manner as described above.

Thus, in the method, the conductive layer 8 can be etched using both of the second etching resist 19 and the insulating cover layer 11 as the etching resist.

In the description given above, the conductive pattern 4 and the mark 9 are formed by the additive method. However, it is also possible to form the conductive pattern 4 and the mark 9 by, e.g., a subtractive method, as shown in FIGS. 10 and 11.

Figure 10:
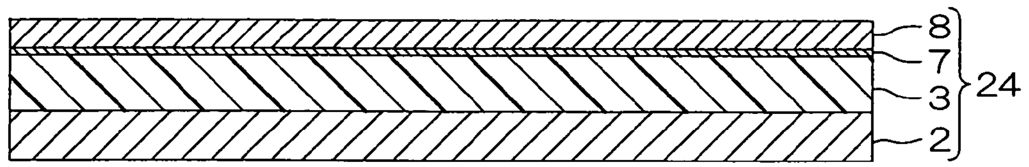
FIG. 10 is a producing process view of the producing method of the suspension board with circuit according to still another embodiment of the present invention, which is taken along the line A-A of FIG. 1, (a) showing the step of preparing a four-layer base material laminated with the metal supporting board, the insulating base layer, the seed film, and the conductive layer in this order, (b) showing the step of laminating the photoresist on the conductive layer, (c) showing the step of exposing the photoresist to light via the photomask, (d) showing the step of developing the photoresist to form a first etching resist in the same pattern as the conductive pattern, and as the pattern of the mark, and (e) showing the step of etching the conductive layer and the seed film each exposed from the first etching resist.
Figure 10:
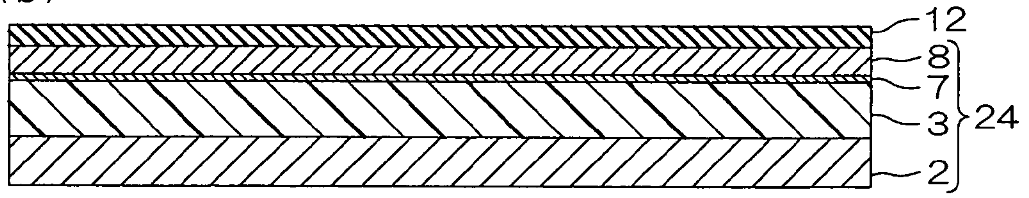
Figure 10:
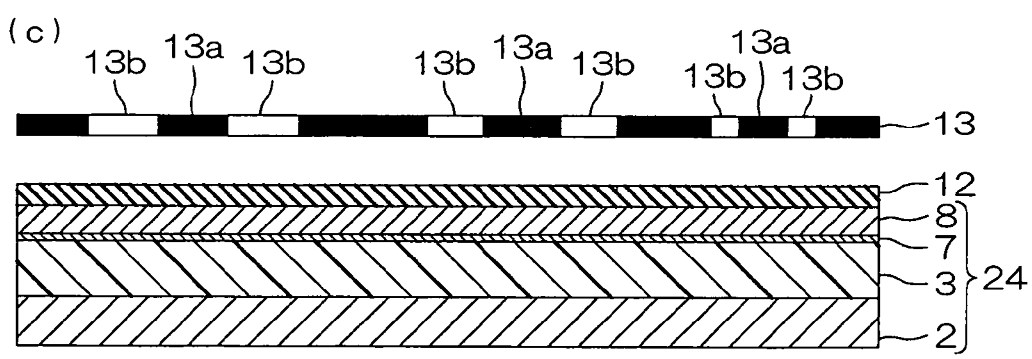
Figure 10:
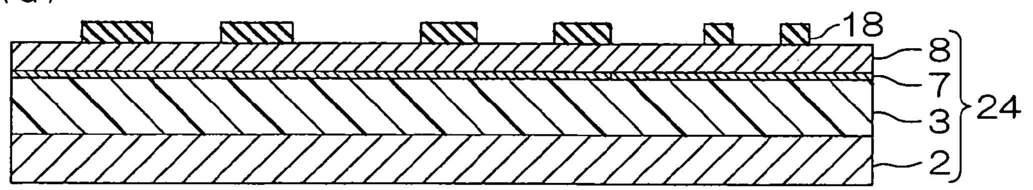
Figure 10:
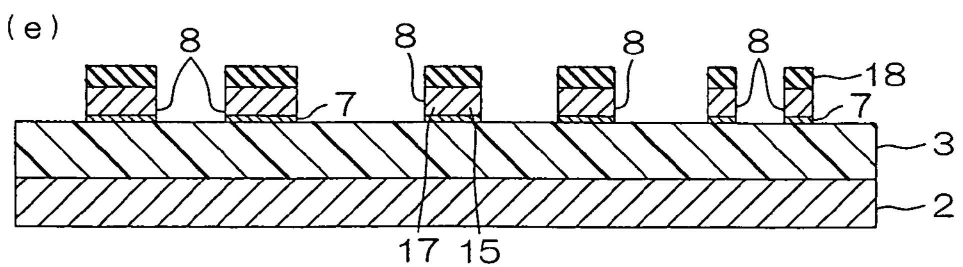
Figure 11:
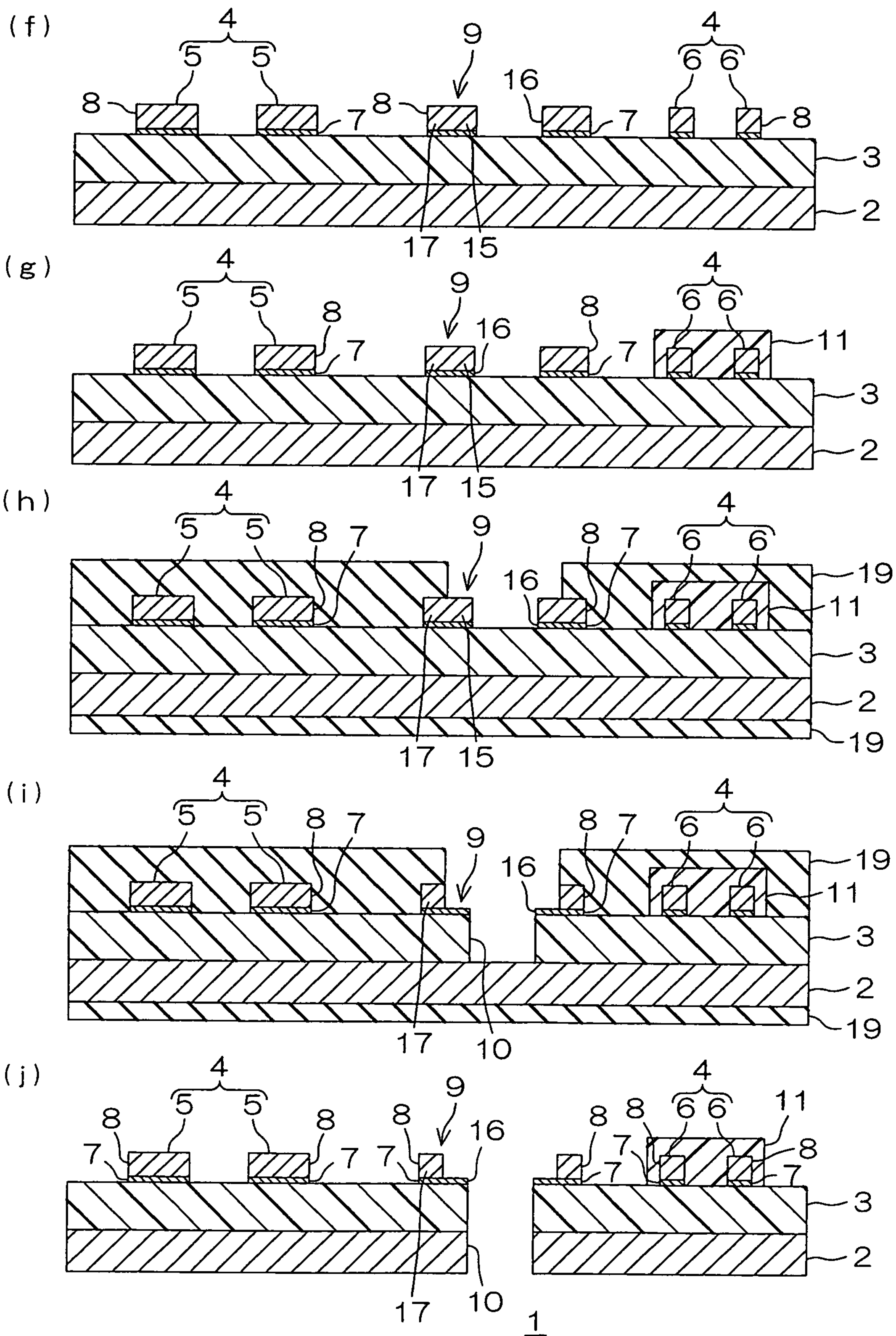
FIG. 11 is a producing process view of the producing method of the suspension board with circuit according to the still another embodiment of the present invention, subsequently to FIG. 10, which is taken along the line A-A of FIG. 1, (f) showing the step of removing the first etching resist, (g) showing the step of forming the insulating cover layer on the insulating base layer, (h) showing the step of forming the second etching resist so as to cover the conductive pattern, and partly expose the mark, (i) showing the step of etching the insulating base layer exposed from the seed film, and (j) showing the step of etching the metal supporting board exposed from the seed film, and removing the second etching resist.

To simultaneously form the conductive pattern 4 and the mark 9 by the subtractive method, a four-layer base material 24 laminated with the metal supporting board 2, the insulating base layer 3, the seed film 7, and the conductive layer 8 in this order is prepared first, as shown in FIG. 10(*a*).

More specifically, in the four-layer base material 24, the insulating base layer 3 is laminated on the metal supporting board 2, the seed film 7 is laminated on the insulating base layer 3, and the conductive layer 8 is formed on the seed film 7. A metal material for forming the metal supporting board 2, an insulating material for forming the insulating base layer 3, a material for forming the seed film 7, and a conductive material for forming the conductive layer 8 are the same as mentioned above. The respective thicknesses of the metal supporting board 2, the insulating base layer 3, the seed film 7, and the conductive layer 8 are also the same as mentioned above.

Next, as shown in FIG. 10(*b*), the photoresist 12 is laminated on the conductive layer 8 (conductive layer 8 laminated on the insulating base layer 3 via the seed film 7). The photoresist 12 is laminated by the same method as described above.

Next, as shown in FIG. 10(*c*), the photoresist 12 is exposed to light via the photomask 13, and then developed, as shown in FIG. 10(*d*), to form a first etching resist 18 in the same pattern as the conductive pattern 4, and as the pattern of the mark 9.

In the exposure to light and the development via the photomask 13, the light transmission portions 13*b* are opposed to the portions where the conductive pattern 4 and the mark 9 are formed, and then the photoresist 12 is exposed to light, and developed.

In this manner, the first etching resist 18 is formed in the same pattern as the conductive pattern 4, and as the pattern of the mark 9 on the surface of the conductive layer 8.

Then, as shown in FIG. 10(*e*), the conductive layer 8 and the seed film 7, each exposed from the first etching resist 18, are etched. For the etching of the conductive layer 8 and the seed film 7, chemical etching using, e.g., an etchant is used.

In this manner, the conductive pattern 4 and the mark 9, each made of the conductive layer 8 and the seed film 7, are formed by the subtractive method.

Then, as shown in FIG. 11(*f*), the first etching resist 18 is removed. The first etching resist 18 is removed by, e.g., etching, stripping, or the like.

Then, as shown in FIG. 11(*g*), the insulating cover layer 11 is formed in the foregoing pattern on the insulating base layer 3. For the formation of the insulating cover layer 11, the same method as described above is used.

Then, as shown in FIGS. 11(*h*) to 11(*j*), the reference hole 10 is formed. To form the reference hole 10, the same method as described in FIGS. 8(*k*) to 8(*m*) is used.

Since the conductive pattern 4 and the mark 9 are both formed on the insulating base layer 3 in the method, more accurate relative positioning can be ensured.

In addition, since the conductive pattern 4 and the mark 9 are formed by the subtractive method using the four-layer base material 24, the number of steps for forming the conductive layer 8 and the seed film 7 can be reduced.

In the method described above, the four-layer base material 24 is prepared, preliminarily laminated with the metal supporting board 2, the insulating base layer 3, the seed film 7, and the conductive layer 8. However, it is also possible to, e.g., successively laminate the individual layers and the film each mentioned above, though not shown. For example, it is also possible to prepare the metal supporting board 2 first, laminate the insulating base layer 3 on the metal supporting board 2, laminate the seed film 7 on the insulating base layer 3, and then laminate the conductive layer 8 thereon.

Figure 14:
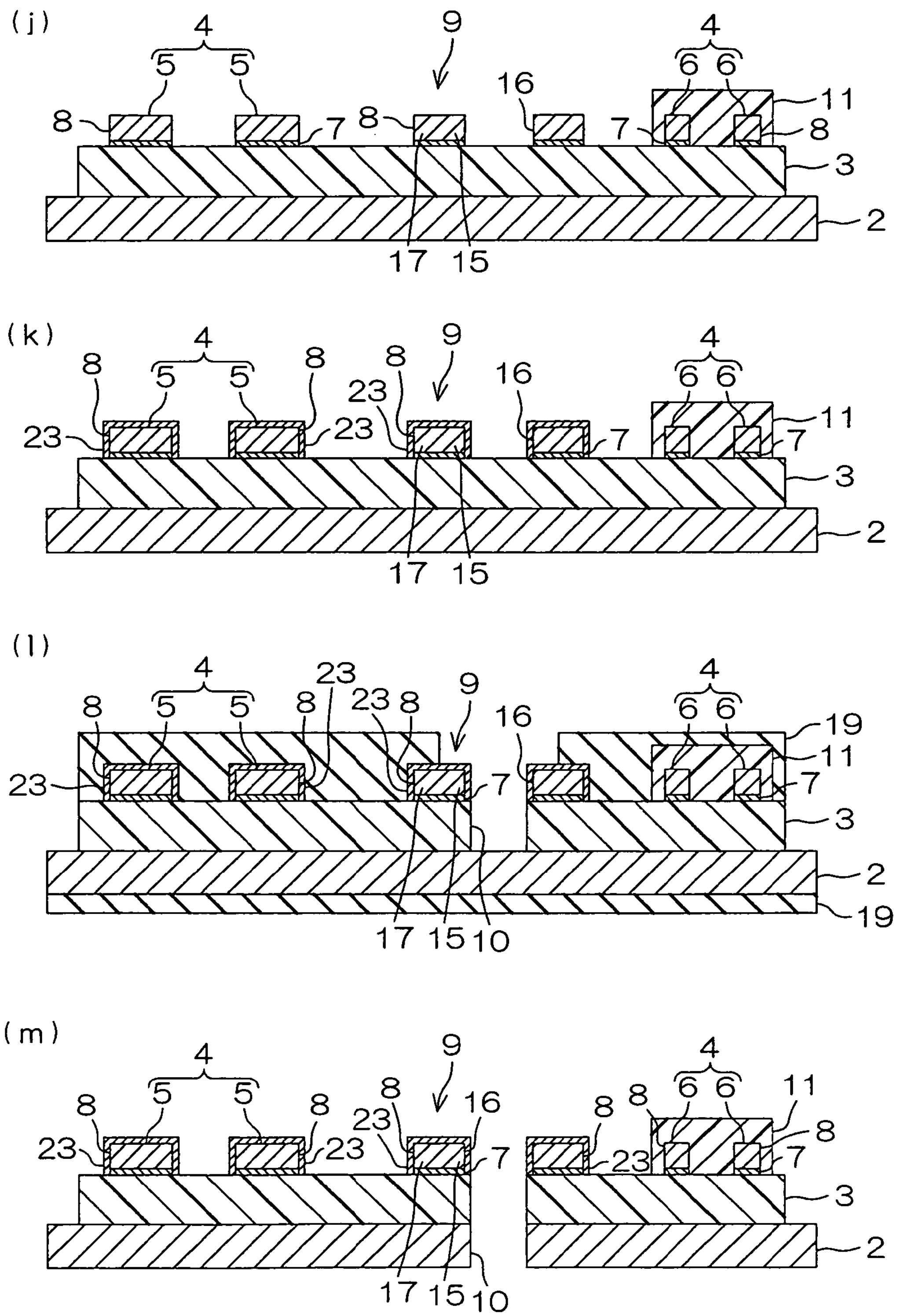
FIG. 14 is a producing process view of the producing method of the suspension board with circuit according to the yet another embodiment of the present invention, subsequently to FIG. 13, which is taken along the line A-A of FIG. 1, (j) showing the step of forming the insulating cover layer on the insulating base layer, (k) showing the step of forming metal plating layers on the surfaces of terminal portions, and on the surface of the mark, (l) showing the step of forming the second etching resist so as to partly expose the metal plating layer on the surface of the mark, and subsequently etching the insulating base layer exposed from the metal plating layer formed on the surface of the mark using the metal plating layer as an etching resist, and (m) showing the step of etching the metal supporting board exposed from the metal plating layer, and then removing the second etching resist.

Next, a description is given to the suspension board with circuit produced by the producing method of the suspension board with circuit according to still another embodiment of the present invention with reference to FIG. 14(*m*).

As shown in FIG. 14(*m*), in the suspension board with circuit 1, metal plating layers 23 are formed on the surfaces of the terminal portions 5. Specifically, the metal plating layer 23 is formed on the side surfaces and top surfaces of the terminal portions 5.

The metal plating layer 23 is also formed on the mark 9. Specifically, the metal plating layer 23 is formed on the surfaces (top surface and side surfaces) of the mark 9.

Next, a description will be given to the producing method of the suspension board with circuit 1 with reference to FIGS. 12 to 14.

Figure 12:
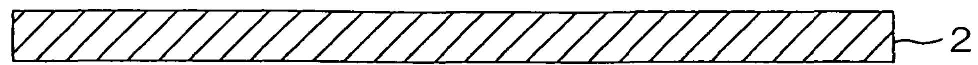
FIG. 12 is a producing process view of the producing method of the suspension board with circuit according to yet another embodiment of the present invention, which is taken along the line A-A of FIG. 1, (a) showing the step of preparing the metal supporting board, (b) showing the step of forming the insulating base layer on the metal supporting board, (c) showing the step of forming the seed film on the insulating base layer, and on the metal supporting board exposed from the insulating base layer, (d) showing the step of laminating the photoresist on the seed film, and (e) showing the step of exposing the photoresist to light via the photomask.
Figure 12:
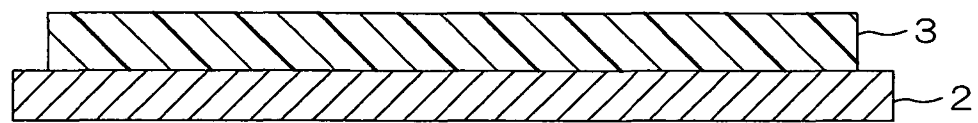
Figure 12:
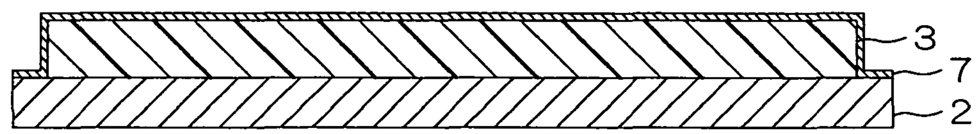
Figure 12:
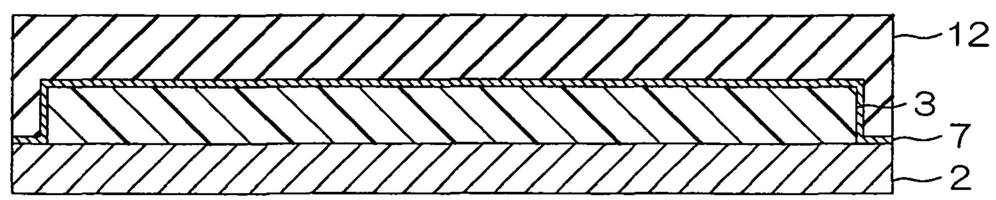
Figure 12:
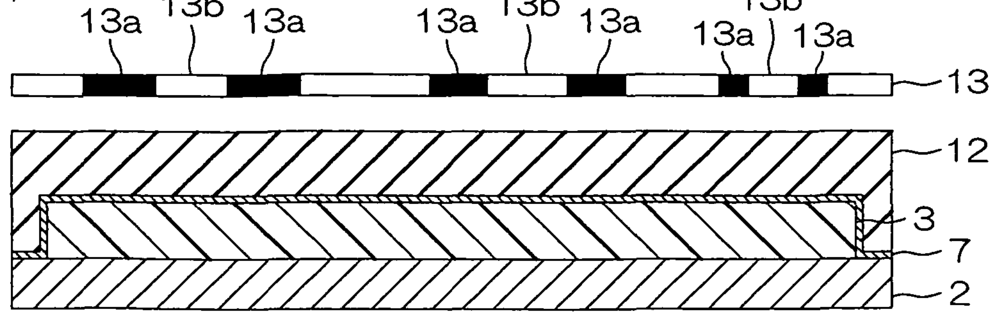
Figure 13:
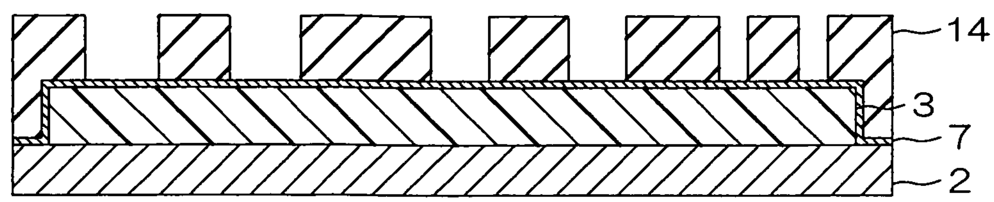
FIG. 13 is a producing process view of the producing method of the suspension board with circuit according to the yet another embodiment of the present invention, subsequently to FIG. 12, which is taken along the line A-A of FIG. 1, (f) showing the step of developing the photoresist to form the plating resist in the pattern reverse to the conductive pattern, and to the pattern of the mark, (g) showing the step of laminating the conductive layer on the seed film exposed from the plating resist, (h) showing the step of removing the plating resist, and (i) showing the step of removing the seed film exposed from the conductive layer.
Figure 13:
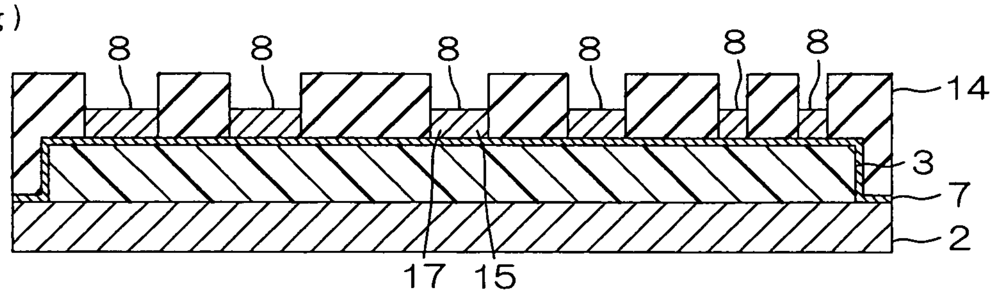
Figure 13:
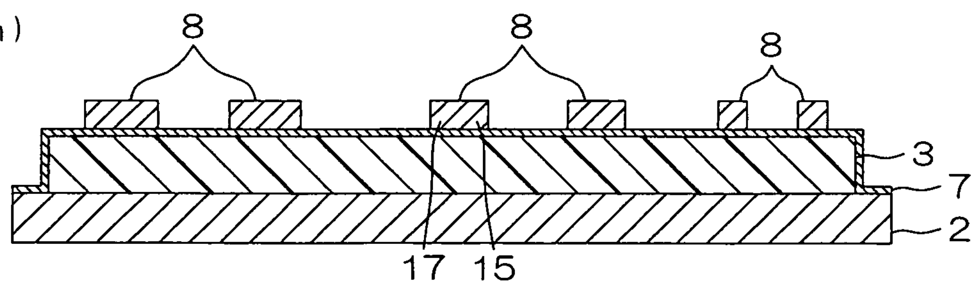
Figure 13:
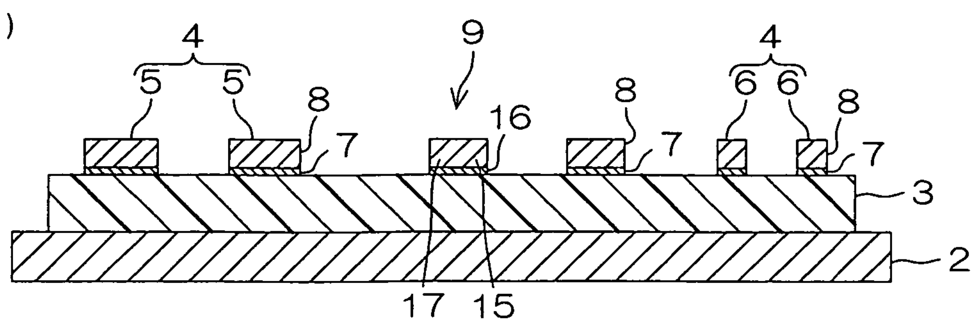

First, as shown in FIG. 12(*a*), the metal supporting board 2 is prepared in the method. A metal material for forming the metal supporting board 2, and the thickness of the metal supporting board 2 are the same as mentioned above.

Next, as shown in FIG. 12(*b*), the insulating base layer 3 is formed on the surface of the metal supporting board 2. For the formation of the insulating base layer 3, the same method as described above is used.

Next, as shown in FIGS. 12(*c*) to 13(*i*), the conductive pattern 4 and the mark 9 are simultaneously formed by an additive method.

To form the conductive pattern 4 and the mark 9 by the additive method, the same additive method as described above with reference to FIGS. 6(*c*) to 7(*i*) is used.

Next, as shown in FIG. 14(*j*), the insulating cover layer 11 is formed in the foregoing pattern on the insulating base layer 3. For the formation of the insulating cover layer 11, the same method as described above is used.

Next, as shown in FIG. 14(*k*), the metal plating layers 23 are formed on the respective surfaces of the terminal portions 5 and the mark 9.

Examples of a metal used to form the metal plating layers 23 include a metal which is not corroded by etching described later, such as, e.g., chromium, gold, silver, platinum, nickel, titanium, manganese, zirconium, or tin. In terms of corrosion resistance by an etchant, gold is preferably used.

The metal plating layer 23 is formed by, e.g., electroless plating or the like, or preferably electroless gold plating. The thickness of the metal plating layer 23 thus formed is in the range of, e.g., 0.01 to 1 μm, or preferably 0.01 to 0.1 μm.

Next, as shown in FIGS. 14(*l*) and 14(*m*), the reference hole 10 is formed.

To form the reference hole 10, the second etching resist 19 is formed first so as to cover the insulating cover layer 11 and the metal plating layers 23 of the terminal portions 5, and partly expose the metal plating layer 23 on the surface of the mark 9, as shown in FIG. 14(*l*). Specifically, the second etching resist 19 is formed to expose the inner end portion 15 of the conductive layer 8 having the generally annular shape when viewed in plan view at the surface of the mark 9.

Subsequently, the insulating base layer 3 exposed from the metal plating layer 23 formed on the surface of the mark 9 is etched using the metal plating layer 23 formed on the surface of the mark 9 as an etching resist (mask).

For the etching of the insulating base layer 3, the same method as described above is used.

Next, as shown in FIG. 14(*m*), the metal supporting board 2 exposed from the metal plating layer 23 formed on the surface of the mark 9 is etched using the metal plating layer 23 formed on the surface of the mark 9 as an etching resist (mask).

For the etching of the metal supporting board 2, the same method as described above is used.

Thereafter, the second etching resist 19 is removed by the same method as described above.

In this manner, the reference hole 10 can be formed.

Thus, in the method, the insulating base layer 3 and the metal supporting board 2, both exposed from the metal plating layers 23, are etched using the metal plating layers 23 as the etching resist. Therefore, it is possible to reliably form the reference hole 10 by a simple and convenient method.

In the method shown in FIGS. 14(*j*) and 14(*k*) described above, the insulating cover layer 11 is formed, and then metal plating layers 23 are formed. However, the formation order of the insulating cover layer 11 and the metal plating layers 23 is not limited thereto. For example, it is also possible to, e.g., form the metal plating layers 23 first, and then form the insulating cover layer 10, though not shown. In this case, the metal plating layers 23 are formed also on the surfaces of the wires 6.

In the description given above, the conductive pattern 4 and the mark 9 are formed by the additive method. However, it is also possible to form the conductive pattern 4 and the mark 9 by, e.g., a subtractive method, as shown in FIGS. 15(*a*) to 15(*f*).

Figure 16:
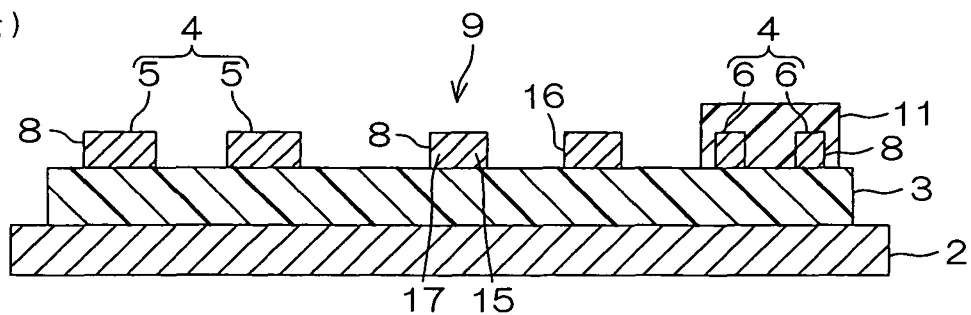
FIG. 16 is a producing process view of the producing method of the suspension board with circuit according to the still another embodiment of the present invention, subsequently to FIG. 15, which is taken along the line A-A of FIG. 1, (g) showing the step of forming the insulating cover layer on the insulating base layer, (h) showing the step of forming the metal plating layers on the surfaces of the terminal portions, and on the surface of the mark, (i) showing the step of forming the second etching resist so as to partly expose the metal plating layer on the surface of the mark, and subsequently etching the insulating base layer exposed from the metal plating layer, and (j) showing the step of etching the metal supporting board exposed from the metal plating layer, and then removing the second etching resist.
Figure 16:
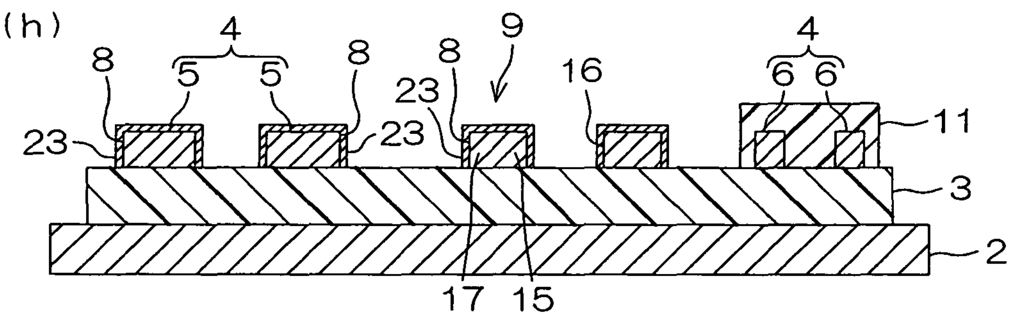
Figure 16:
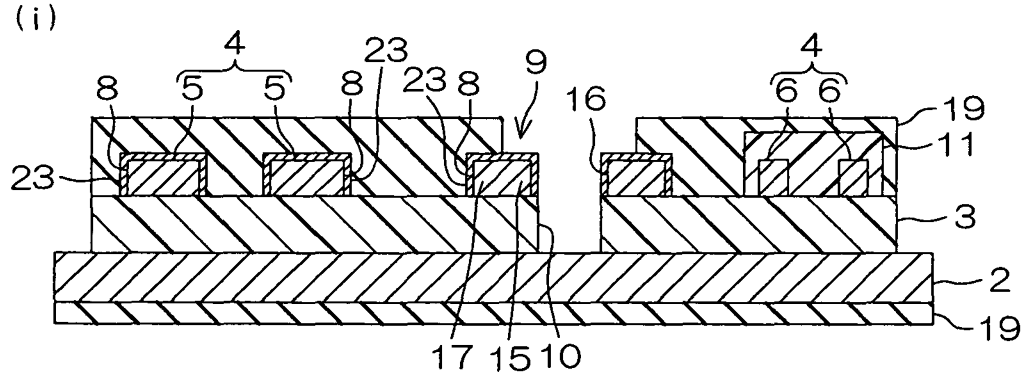
Figure 16:
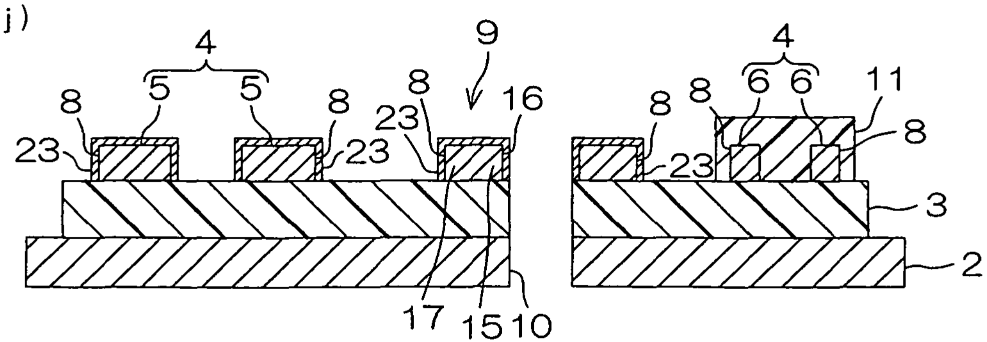

As shown in FIG. 16(*j*), in the suspension board with circuit 1 in which the conductive pattern 4 and the mark 9 are formed by the subtractive method, the conductive pattern 4 and the mark 9 are each formed only of the conductive layer 8.

Figure 15:
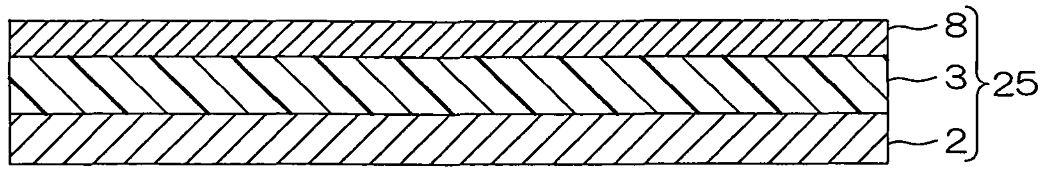
FIG. 15 is a producing process view of the producing method of the suspension board with circuit according to still another embodiment of the present invention, which is taken along the line A-A of FIG. 1, (a) showing the step of preparing a three-layer base material laminated with the metal supporting board, the insulating base layer, and the conductive layer in this order, (b) showing the step of laminating the photoresist on the conductive layer, (c) showing the step of exposing the photoresist to light via the photomask, (d) showing the step of developing the photoresist to form the first etching resist in the same pattern as the conductive pattern, and as the pattern of the mark, (e) showing the step of etching the conductive layer exposed from the first etching resist, and (f) showing the step of removing the first etching resist.
Figure 15:
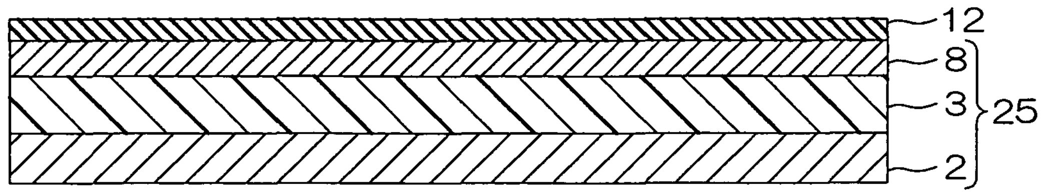
Figure 15:
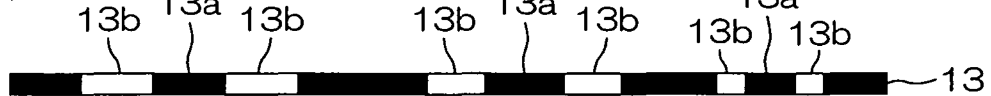
Figure 15:
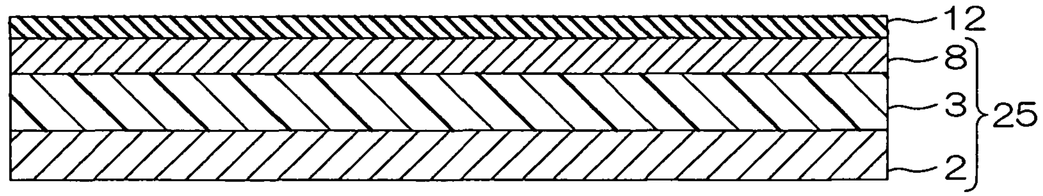
Figure 15:
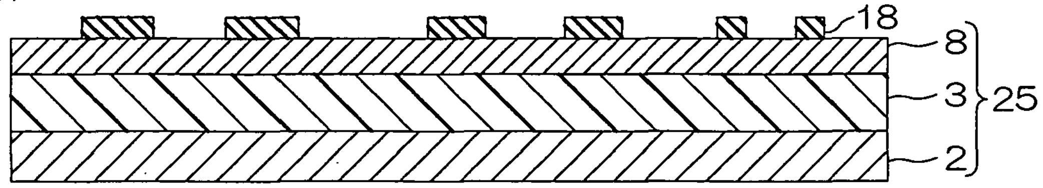
Figure 15:
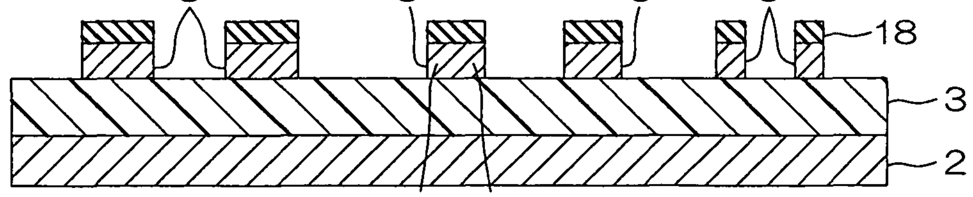
Figure 15:
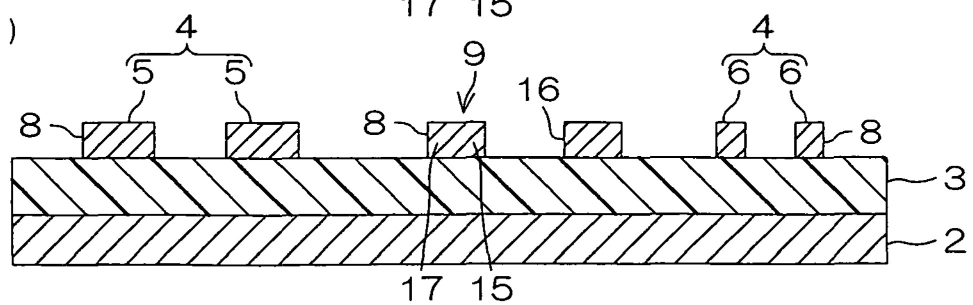

To simultaneously form the conductive pattern 4 and the mark 9 by the subtractive method, as shown in FIG. 15(*a*), a three-layer base material 25 laminated with the metal supporting board 2, the insulating base layer 3, and the conductive layer 8 are preliminarily prepared first. In the three-layer base material 25, the insulating base layer 3 is laminated on the metal supporting board 2, and the conductive layer 8 is formed on the insulating base layer 3.

Then, as shown in FIG. 15(*b*), the photoresist 12 is laminated directly on the conductive layer 8, as shown in FIG. 15(*b*). The photoresist 12 is laminated by the same method as described above.

Then, as shown in FIG. 15(*c*), the photoresist 12 is exposed to light via the photomask 13, and then developed, as shown in FIG. 15(*d*), to form the first etching resist 18 in the same pattern as the conductive pattern 4, and as the pattern of the mark 9. For the exposure to light and the development via the photomask 13, the same method as described above is used.

Then, as shown in FIG. 15(*e*), the conductive layer 8 exposed from the first etching resist 18 is etched. For the etching of the conductive layer 8, the same method as described above is used.

In this manner, the conductive pattern 4 and the mark 9, each made of the conductive layer 8, are formed by the subtractive method.

Then, as shown in FIG. 15(*f*), the first etching resist 18 is removed. For the removal of the first etching resist 18, the same method as mentioned above is used.

Then, as shown in FIG. 16(*g*), the insulating cover layer 11 is formed in the foregoing pattern on the insulating base layer 3. For the formation of the insulating cover layer 11, the same method as described above is used.

Then, as shown in FIG. 16(*h*), the metal plating layers 23 are formed on the respective surfaces of the terminal portions 5 and the mark 9. For the formation of the metal plating layers 23, the same method as mentioned above is used.

Then, as shown in FIGS. 16(*l*) and 16(*m*), the reference hole 10 is formed. To form the reference hole 10, the same method as described in FIGS. 14(*l*) and 14(*m*) is used.

Thus, in this method, the conductive pattern 4 and the mark 9 are formed by the subtractive method using the three-layer base material 25 in the method, the number of steps for forming the conductive layer 8 can be reduced. In contrast to the additive method using the seed film 7, the subtractive method used in the method does not require the formation of the seed film 7. Accordingly, it is also possible to reduce the number of process steps for forming the seed film 7.

In the method described above, the three-layer base material 25 is prepared, preliminarily laminated with the metal supporting board 2, the insulating base layer 3, and the conductive layer 8 in this order, as shown in FIG. 15(*a*). However, it is also possible to, e.g., successively laminate the individual layers mentioned above. Further, a two-layer base material made of the insulating base layer 3, and the conductive layer 8 laminated on the insulating base layer 3, and then may be prepared the metal supporting board 2 may be bonded to the back surface (lower surface of the insulating base layer 3) of the two-layer base material.

In the method described above, the three-layer base material 25 in which the seed film is not laminated is used. However, it is also possible to use, e.g., the four-layer base material 24 (see FIG. 10(*a*)) including the seed film 7.

While the illustrative embodiments of the present invention are provided in the above description, such is for illustrative purpose only and it is not to be construed limitative. Modification and variation of the present invention which will be obvious to those skilled in the art is to be covered by the following claims.

What is claimed is:

1. A producing method of a suspension board with circuit, the producing method comprising:

simultaneously forming a conductive pattern and a mark, wherein the conductive pattern is formed on an insulating layer which in turn is formed on a metal supporting board, and the conductive pattern has a terminal portion for connecting to an electronic component, and wherein the mark is formed on at least one of the metal supporting board or the insulating layer, and the mark has an opening for forming a reference hole for mounting the electronic component; and forming the reference hole by etching at least one of the metal supporting board, which is disposed in the opening of the mark, or both the insulating layer and the metal supporting board each disposed in the opening of the mark, such that the reference hole is formed in the suspension board with circuit at the same position as that of the opening of the mark when the suspension board with circuit is viewed in a plan view, so that the reference hole is vertically aligned with the opening of the mark.

2. The producing method of the suspension board with circuit according to claim 1, wherein, in the step of simultaneously forming the conductive pattern and the mark, the conductive pattern and the mark are each formed of a conductive layer, and of a seed film formed on a lower surface of the conductive layer and, in the step of forming the reference hole, the reference hole is formed by etching the metal supporting board exposed from the seed film of the mark, or the insulating layer and the metal supporting board each exposed from the seed film of the mark using the seed film as an etching resist.

3. The producing method of the suspension board with circuit according to claim 2, wherein the step of simultaneously forming the conductive pattern and the mark comprises:

forming the seed film on the insulating layer, and on the metal supporting board exposed from the insulating layer;

laminating a photoresist on the seed film;

exposing the photoresist to light via a photomask, and then developing the photoresist to form a plating resist in a pattern reverse to the conductive pattern, and to a pattern of the mark;

laminating the conductive layer on the seed film exposed from the plating resist;

removing the plating resist; and removing the seed film exposed from the conductive layer to form the conductive pattern and the mark, and the step of forming the reference hole comprises:

forming a second etching resist so as to cover the conductive pattern, and partly expose the mark;

etching the conductive layer of the partly exposed mark using the second etching resist as an etching resist; and etching the metal supporting board exposed from the seed film of the mark using the seed film as an etching resist to form the reference hole.

4. The producing method of the suspension board with circuit according to claim 2, wherein the step of simultaneously forming the conductive pattern and the mark comprises:

forming the seed film on the insulating layer;

laminating a photoresist on the seed film;

exposing the photoresist to light via a photomask, and then developing the photoresist to form a plating resist in a pattern reverse to the conductive pattern, and to a pattern of the mark;

laminating the conductive layer on the seed film exposed from the plating resist;

removing the plating resist; and removing the seed film exposed from the conductive layer to form the conductive pattern and the mark, and the step of forming the reference hole comprises:

forming a second etching resist so as to cover the conductive pattern, and partly expose the mark;

etching the conductive layer of the partly exposed mark using the second etching resist as an etching resist; and etching the insulating layer and the metal supporting board each exposed from the seed film of the mark using the seed film as an etching resist to form the reference hole.

5. The producing method of the suspension board with circuit according to claim 2, wherein the step of simultaneously forming the conductive pattern and the mark comprises:

laminating a photoresist on the conductive layer laminated on the insulating layer via the seed film;

exposing the photoresist to light via a photomask, and then developing the photoresist to form a first etching resist in the same pattern as the conductive pattern, and as a pattern of the mark;

etching the conductive layer and the seed film each exposed from the first etching resist to form the conductive pattern and the mark; and removing the first etching resist, and the step of forming the reference hole comprises:

forming a second etching resist so as to cover the conductive pattern, and partly expose the mark;

etching the conductive layer of the partly exposed mark using the second etching resist as an etching resist; and etching the insulating layer and the metal supporting board each exposed from the seed film of the mark using the seed film as an etching resist to form the reference hole.

6. The producing method of the suspension board with circuit according to claim 1, wherein, in the step of simultaneously forming the conductive pattern and the mark, the conductive pattern and the mark are each formed of at least a conductive layer and, in the step of forming the reference hole, the reference hole is formed by forming metal plating layers on a surface of the conductive pattern, and on a surface of the mark, and then etching the insulating layer and the metal supporting board each exposed from the metal plating layer on the surface of the mark using the metal plating layer formed on the surface of the mark as an etching resist.

7. The producing method of the suspension board with circuit according to claim 6, wherein the step of simultaneously forming the conductive pattern and the mark comprises:

forming the seed film on the insulating layer;

laminating a photoresist on the seed film;

exposing the photoresist to light via a photomask, and then developing the photoresist to form a plating resist in a pattern reverse to the conductive pattern, and to a pattern of the mark;

laminating the conductive layer on the seed film exposed from the plating resist;

removing the plating resist; and removing the seed film exposed from the conductive layer to form the conductive pattern and the mark, and the step of forming the reference hole comprises:

forming a second etching resist so as to cover the metal plating layer on the surface of the conductive pattern, and partly expose the metal plating layer on the surface of the mark.

8. The producing method of the suspension board with circuit according to claim 6, wherein the step of simultaneously forming the conductive pattern and the mark comprises:

laminating a photoresist on the conductive layer laminated on the insulating layer;

exposing the photoresist to light via a photomask, and then developing the photoresist to form a first etching resist in the same pattern as the conductive pattern, and as a pattern of the mark;

etching the conductive layer exposed from the first etching resist to form the conductive pattern and the mark; and removing the first etching resist, and the step of forming the reference hole comprises:

forming a second etching resist so as to cover the metal plating layer on the surface of the conductive pattern, and partly expose the metal plating layer on the surface of the mark.

9. The producing method of the suspension board with circuit according to claim 3, wherein, in the step of simultaneously forming the conductive pattern and the mark, the photoresist is exposed to light via the single photomask.

10. The producing method of the suspension board with circuit according to claim 4, wherein, in the step of simultaneously forming the conductive pattern and the mark, the photoresist is exposed to light via the single photomask.

11. The producing method of the suspension board with circuit according to claim 5, wherein, in the step of simultaneously forming the conductive pattern and the mark, the photoresist is exposed to light via the single photomask.

12. The producing method of the suspension board with circuit according to claim 7, wherein, in the step of simultaneously forming the conductive pattern and the mark, the photoresist is exposed to light via the single photomask.

13. The producing method of the suspension board with circuit according to claim 8, wherein, in the step of simultaneously forming the conductive pattern and the mark, the photoresist is exposed to light via the single photomask.

* * * * *